United States Patent
Cheng et al.

(10) Patent No.: US 12,439,709 B2
(45) Date of Patent: Oct. 7, 2025

(54) IMAGE SENSOR WITH DIFFUSION BARRIER STRUCTURE

(71) Applicant: Taiwan Semiconductor Manufacturing Company, Ltd., Hsinchu (TW)

(72) Inventors: Yu-Hung Cheng, Tainan (TW); Ching I Li, Tainan (TW); Chen-Hao Chiang, Jhongli (TW); Eugene I-Chun Chen, Taipei (TW); Chin-Chia Kuo, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 631 days.

(21) Appl. No.: 17/680,987

(22) Filed: Feb. 25, 2022

(65) Prior Publication Data

US 2023/0033270 A1 Feb. 2, 2023

Related U.S. Application Data

(60) Provisional application No. 63/227,363, filed on Jul. 30, 2021.

(51) Int. Cl.
*H10F 39/12* (2025.01)
*H10F 39/00* (2025.01)

(52) U.S. Cl.
CPC ......... *H10F 39/199* (2025.01); *H10F 39/026* (2025.01); *H10F 39/802* (2025.01)

(58) Field of Classification Search
CPC ..... H10F 39/026; H10F 39/199; H10F 39/802
See application file for complete search history.

(56) References Cited

U.S. PATENT DOCUMENTS

| | | | | |
|---|---|---|---|---|
| 2005/0282306 A1* | 12/2005 | Yamanaka | ............ | H10F 39/811 438/57 |
| 2015/0130009 A1* | 5/2015 | Eikyu | ................... | H10F 39/803 257/431 |
| 2019/0148570 A1* | 5/2019 | Wu | ........................ | H10F 39/011 257/187 |

(Continued)

OTHER PUBLICATIONS

Takeuchi et al. "Punch-Through Stop Doping Profile Control via Interstitial Trapping by Oxygen-Insertion Silicon Channel" Digital Object Identifier 10.1109/JEDS.2017.2769682, published on Nov. 3, 2017.

(Continued)

*Primary Examiner* — Yara B Green
*Assistant Examiner* — Christopher M Roland
(74) *Attorney, Agent, or Firm* — Eschweiler & Potashnik, LLC

(57) ABSTRACT

The present disclosure relates to an integrated chip. The integrated chip includes a sensor semiconductor layer. The sensor semiconductor layer is doped with a first dopant. A photodetector is along a frontside of the sensor semiconductor layer. A backside semiconductor layer is along a backside of the sensor semiconductor layer, opposite the frontside. The backside semiconductor layer is doped with a second dopant. A diffusion barrier structure is between the sensor semiconductor layer and the backside semiconductor layer. The diffusion barrier structure includes a third dopant different from the first dopant and the second dopant.

20 Claims, 13 Drawing Sheets

(56) References Cited

U.S. PATENT DOCUMENTS

2024/0379692 A1* 11/2024 Cheng ................. H10F 39/802

OTHER PUBLICATIONS

Ruecker et al. "Suppressed diffusion of boron and carbon in carbon-rich silicon" Appl. Phys. Lett. 73, 1682 (1998), published on Sep. 16, 1998.
Jegannathan et al. "Current-Assisted Single Photon Avalanche Diode (CASPAD) Fabricated in 350 nm Conventional CMOS" Appl. Sci. 2020, 10, 2155, published on Mar. 22, 2020.
Calmon et al. "Indirect avalanche event detection of Single Photon Avalanche Diode implemented in CMOS FDSOI technology" Solid-State Electronics, vol. 163, Jan. 2020, 107636, published on Sep. 14, 2019.
Katz et al. "Active-Reset for the N+P Single-Ended SPAD Used in the NIR LiDAR Receivers" IEEE Transactions on Electron Devices, vol. 66, No. 12, Dec. 2019.
Mirabella et al. "Self-interstitials and substitutional C in silicon: Interstitial-trapping and C-clustering" Mat. Res. Soc. Symp. Proc. Vol. 717 Materials Research Society, published in 2002.

* cited by examiner

IMAGE SENSOR WITH DIFFUSION BARRIER STRUCTURE

REFERENCE TO RELATED APPLICATION

This Application claims the benefit of U.S. Provisional Application No. 63/227,363, filed on Jul. 30, 2021, the contents of which are hereby incorporated by reference in their entirety.

BACKGROUND

Integrated circuits (ICs) with complementary metal-oxide-semiconductor (CMOS) image sensors are used in a wide range of modern-day electronic devices, such as, for example, cameras and cell phones. Some CMOS image sensors are based on avalanche photodiodes (APD) and single-photon avalanche photodiodes (SPAD). Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
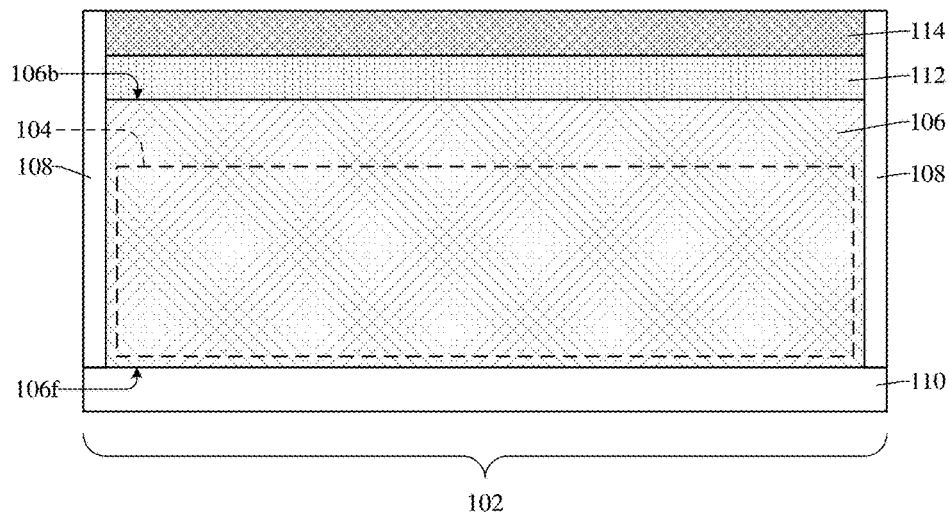
FIG. 1 illustrates a cross-sectional view of some embodiments of an integrated chip comprising an image sensor, the image sensor comprising a diffusion barrier structure between a sensor semiconductor layer and a backside semiconductor layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips include image sensors. For example, an image sensor includes a plurality of pixels. A pixel includes a sensor semiconductor layer having a first doping type and a first dopant concentration. A photodetector is within the sensor semiconductor layer. A backside semiconductor layer having the first doping type and a second dopant concentration, greater than the first dopant concentration, extends along the sensor semiconductor layer. The backside semiconductor layer may be included in the image sensor in an effort to pin (e.g., control a size of) a depletion region of the photodetector. As a result, a breakdown voltage of the photodetector may be stabilized (e.g., a variability of the breakdown voltage may be reduced) and hence a performance of the image sensor may be improved. Further, the backside semiconductor layer may be included in the image sensor in an effort to passivate a backside of the image sensor. For example, the backside semiconductor layer may be included to passivate defects (e.g., dangling bonds or the like) along a backside of the sensor semiconductor layer. As a result, a performance of the image sensor may be further improved. For example, a dark current (e.g., a leakage current that exists even while photons are not impinging on the photodetector) of the image sensor may be reduced.

A challenge with these image sensors is that the dopant from the backside semiconductor layer may diffuse into the sensor semiconductor layer. For example, interstitial defects and/or vacancies that may exist along a backside of the sensor semiconductor layer and/or along an interface between the sensor semiconductor layer and the backside semiconductor layer may increase a transient enhanced diffusion (TED) of the dopant from the backside semiconductor layer into the sensor semiconductor layer. As a result, the dopant concentration of the sensor semiconductor layer may be unintentionally altered. This unintentional change in the dopant concentration of the sensor semiconductor layer may negatively affect a performance of the image sensor. For example, an effective thickness of the sensor semiconductor layer may be reduced and hence a size of the depletion region may be reduced. As a result, a full well capacity (FWC) of the pixel(s) may be reduced and hence a performance of the image sensor may be reduced. Further, this unintentional change in the dopant concentration of the sensor semiconductor layer may cause the breakdown voltage of the image sensor to experience increased variability. Thus, the performance of the image sensor may be further reduced.

Various embodiments of the present disclosure are related to an integrated chip comprising an image sensor, the image sensor comprising a diffusion barrier structure between a sensor semiconductor layer and a backside semiconductor layer for reducing a diffusion of a dopant from the backside semiconductor layer into the sensor semiconductor layer. A photodetector is in the sensor semiconductor layer along a frontside of the sensor semiconductor layer. The backside semiconductor layer is along a backside of the sensor semiconductor layer, opposite the frontside. The diffusion barrier structure is arranged between the sensor semiconductor layer and the backside semiconductor layer.

By including the diffusion barrier structure in the image sensor between the sensor semiconductor layer and the backside semiconductor layer, a diffusion of a dopant from the backside semiconductor layer into the sensor semiconductor layer may be reduced. As a result, a performance of the image sensor may be improved. For example, in some embodiments, the sensor semiconductor layer has a first doping type and is doped with a first dopant; the backside semiconductor layer has a second doping type and is doped with a second dopant; and the diffusion barrier structure comprises a diffusion barrier layer which is doped with a third dopant, different from the first dopant and the second dopant. The diffusion barrier layer may reduce, block, or trap interstitials and/or other defects along the sensor semiconductor layer and the backside semiconductor layer. Thus, the diffusion barrier layer may reduce a diffusion (e.g., a TED) of the second dopant from the backside semiconductor layer into the sensor semiconductor layer may be reduced. By reducing the diffusion of the second dopant into the sensor semiconductor layer, an effective thickness of the sensor semiconductor layer may be maintained and hence the size of a depletion region of the photodetector may be maintained. Thus, the FWC of pixel(s) of the image sensor may be maintained. In addition, a variability of a breakdown voltage of the photodetector may be reduced. Thus, a performance of the image sensor may be further improved.

FIG. 1 illustrates a cross-sectional view 100 of some embodiments of an integrated chip comprising an image sensor, the image sensor comprising a diffusion barrier structure 112 between a sensor semiconductor layer 106 and a backside semiconductor layer 114.

The image sensor comprises a pixel 102. A trench isolation structure 108 surrounds the pixel 102 along a boundary of the pixel 102 and separates the pixel 102 from neighboring pixels (not shown) of the image sensor. The sensor semiconductor layer 106 is over a logic device wafer 110. The sensor semiconductor layer 106 has a first doping type (e.g., p-type or n-type), is doped with a first dopant, and has a first dopant concentration. A photodetector 104 is within the sensor semiconductor layer 106 and is arranged along a frontside 106f of the sensor semiconductor layer 106. The backside semiconductor layer 114 is over the sensor semiconductor layer 106 and is along a backside 106b of the sensor semiconductor layer 106, opposite the frontside 106f. The backside semiconductor layer 114 has the first doping type, is doped with a second dopant, and has a second dopant concentration that is greater than the first dopant concentration.

In some embodiments, the trench isolation structure 108 may not extend through the whole sensor semiconductor layer 106, the whole diffusion barrier structure 112, and/or the whole backside semiconductor layer 114. For example, in some embodiments, the trench isolation structure 108 may extend through the backside semiconductor layer 114, through the diffusion barrier structure 112, and into the sensor semiconductor layer 106, but not through the entire thickness of the sensor semiconductor layer 106. In some other embodiments, the trench isolation structure 108 may extend through the sensor semiconductor layer 106 and into the diffusion barrier structure 112, but not through the diffusion barrier structure 112 nor into the backside semiconductor layer 114. The trench isolation structure 108 may be shorter, may have a curved distal end, may include more than one trench along the same boundary, and may extend from the back side and/or front side.

The diffusion barrier structure 112 is arranged between the sensor semiconductor layer 106 and the backside semiconductor layer 114. The diffusion barrier structure 112 comprises a third dopant different from the first dopant and the second dopant. For example, in some embodiments, the diffusion barrier structure 112 comprises a diffusion barrier layer (e.g., 502a of FIG. 5) which comprises a semiconductor (e.g., silicon or some other suitable material) doped with the third dopant.

In some embodiments, the sensor semiconductor layer 106 and the backside semiconductor layer may, for example, comprise silicon or some other suitable semiconductor material. In some embodiments, the first dopant is boron or some other suitable dopant. In some embodiments, the second dopant is boron or some other suitable dopant. In some embodiments, the third dopant is oxygen, carbon, some other suitable dopant, or any combination of the foregoing. For example, in some embodiments, the sensor semiconductor layer 106 and the backside semiconductor layer 114 are both doped with boron or some other suitable dopant, and the diffusion barrier structure 112 (e.g., the diffusion barrier layer of the diffusion barrier structure) comprises oxygen, carbon, some other suitable dopant, or any combination of the foregoing.

By including the diffusion barrier structure 112 in the image sensor between the sensor semiconductor layer 106 and the backside semiconductor layer 114, a diffusion (e.g., a TED) of the second dopant from the backside semiconductor layer 114 into the sensor semiconductor layer 106 may be reduced. For example, the oxygen, carbon, or other suitable dopant of the diffusion barrier structure 112 may reduce, block, or trap interstitials and/or other defects along the sensor semiconductor layer 106 and the backside semiconductor layer 114. By reducing the diffusion of the second dopant into the sensor semiconductor layer 106, a performance of the image sensor may be improved. For example, an effective thickness of the sensor semiconductor layer 106 may be maintained and hence the size of a depletion region of the photodetector 104 may be maintained. Thus, a full well capacity (FWC) of the pixel 102 of the image sensor may be maintained. In addition, a variability of a breakdown voltage of the photodetector 104 may be reduced.

In some embodiments, the diffusion barrier structure 112 (e.g., a diffusion barrier layer of the diffusion barrier structure 112) further comprises the second dopant (e.g., boron or some other suitable dopant). For example, the second dopant may diffuse from the backside semiconductor layer 114 into the diffusion barrier structure 112. The diffusion barrier structure 112 may then trap the diffused second dopant and may block the diffused second dopant from further diffusing into the sensor semiconductor layer 106.

In some embodiments, the backside semiconductor layer 114 is doped with the second dopant and a fourth dopant different from the first dopant and the second dopant. In some embodiments, the fourth dopant is different from the third dopant. In some embodiments, the fourth dopant is carbon or some other suitable dopant. For example, in some embodiments, the sensor semiconductor layer 106 is doped with boron or some other suitable dopant; the diffusion barrier structure 112 comprises oxygen, carbon, some other suitable dopant, or any combination of the foregoing; and the backside semiconductor layer 114 is doped with both boron and carbon, some other suitable dopant(s), or a combination of the foregoing.

By further doping the backside semiconductor layer 114 with the fourth dopant (e.g., carbon or some other suitable dopant) in addition to the second dopant (e.g., boron or some other suitable dopant), a diffusion (e.g., a TED) of the second dopant from the backside semiconductor layer 114 to the sensor semiconductor layer 106 may be further reduced. For example, the carbon may further reduce, block, or trap interstitial defects or the like. As a result, a performance of the image sensor may be further improved.

In some embodiments, the first dopant concentration is about $1 \times 10^{13}$ to $5 \times 10^{13}$ cm$^{-3}$ or some other suitable value. In some embodiments, the second dopant concentration is about 0.5 to $1.5 \times 10^{17}$ cm$^{-3}$ or some other suitable value. In some embodiments, a concentration of the third dopant in the diffusion barrier structure 112 (e.g., a third dopant concentration) is about $0.1 \times 10^{20}$ to $10 \times 10^{20}$ cm$^{-3}$, about $1 \times 10^{20}$ to $10 \times 10^{20}$ cm$^{-3}$, or some other suitable value.

In some embodiments, a concertation of the fourth dopant in the backside semiconductor layer 114 (e.g., a fourth dopant concentration) is about $0.1 \times 10^{20}$ to $10 \times 10^{20}$ cm$^{-3}$, is greater than about $2 \times 10^{19}$ cm$^{-3}$, or is some other suitable value. For example, in some embodiments where the backside semiconductor layer comprises carbon and boron, a boron concentration of the backside semiconductor layer 114 is about $0.5 \times 10^{17}$ to $1.5 \times 10^{17}$ cm$^{-3}$ or some other suitable value and a carbon concertation of the backside semiconductor layer 114 is about $0.1 \times 10^{20}$ to $10 \times 10^{20}$ cm$^{-3}$, is greater than about $2 \times 10^{19}$ cm$^{-3}$, or is some other suitable value.

In some embodiments, the sensor semiconductor layer 106 has a thickness of about 5 to 7 micrometers or some other suitable thickness. In some embodiments, the backside semiconductor layer 114 has a thickness of about 0.5 to 1.5 micrometers or some other suitable thickness. In some embodiments, the diffusion barrier structure 112 has a thickness of about 10 nanometers, about 5-15 nanometers, greater than 5 nanometers, or some other suitable thickness.

In some embodiments, the trench isolation structure 108 comprises one or more dielectric materials such as, for example, silicon dioxide, silicon nitride, or some other suitable material(s). In some embodiments, the trench isolation structure 108 surrounds the sensor semiconductor layer 106, the diffusion barrier structure 112, and the backside semiconductor layer 114.

Figure 2:
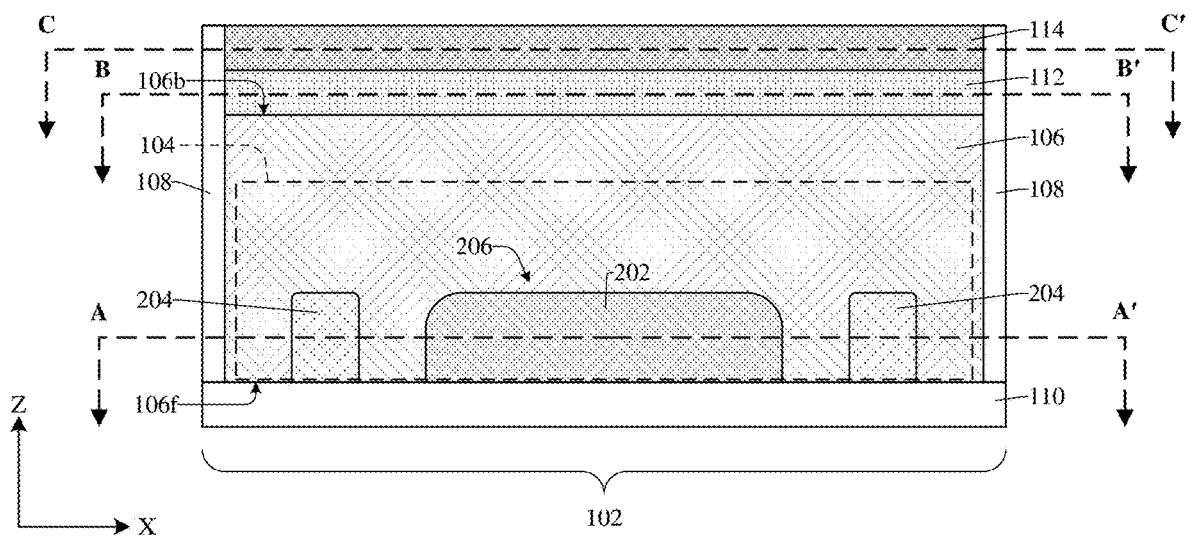
FIG. 2 illustrates a cross-sectional view of some embodiments of the integrated chip of FIG. 1 in which the integrated chip further comprises a first semiconductor region and a second semiconductor region.

In some embodiments, the first doping type may be p-type doping and the second doping type may be n-type doping. In some other embodiments, the first doping type may be n-type doping and the second doping type may be p-type doping FIG. 2 illustrates a cross-sectional view 200 of some embodiments of the integrated chip of FIG. 1 in which the integrated chip further comprises a first semiconductor region 202 and a second semiconductor region 204. In some embodiments, the cross-sectional view 200 of FIG. 2 is illustrated in an X-Z plane.

The first semiconductor region 202 and the second semiconductor region 204 are within the sensor semiconductor layer 106 along the frontside 106f of the sensor semiconductor layer 106. The second semiconductor region 204 laterally surrounds the first semiconductor region 202 (e.g., in a ring shape) and is laterally spaced apart from the first semiconductor region 202 by the sensor semiconductor layer 106. In some embodiments, the first semiconductor region 202 and the second semiconductor region 204 are separately doped regions of the sensor semiconductor layer 106. In some embodiments, the sensor semiconductor layer 106 has a first doping type (e.g., p-type) and has a low dopant concentration (e.g., p− doping); the first semiconductor region 202 has a second doping type (e.g., n-type), opposite the first doping type, and has a high dopant concentration (e.g., n+ doping); and the second semiconductor region 204 has the first doping type (e.g., p-type) and has a high dopant concentration (e.g., p+ doping).

In some embodiments, the first semiconductor region 202, the second semiconductor region 204, and the sensor semiconductor layer 106 form the photodetector 104. For example, the first semiconductor region 202 and the sensor semiconductor layer 106 form a p-n junction along an interface 206 between the first semiconductor region 202 and the sensor semiconductor layer 106. In some embodiments, the photodetector 104 may, for example, be or comprise a photodiode, an avalanche photodiode, a single photon avalanche diode (SPAD), a complimentary metal-oxide-semiconductor (CMOS) photodetector, or some other suitable photodetector.

Figure 3A:
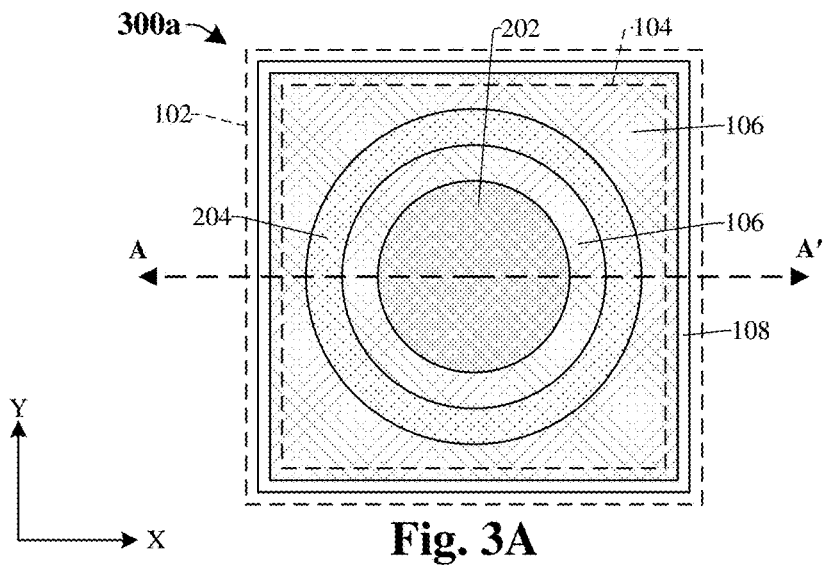
FIGS. 3A-3C illustrate top views of some embodiments of the integrated chip of FIG. 2.
Figure 3B:
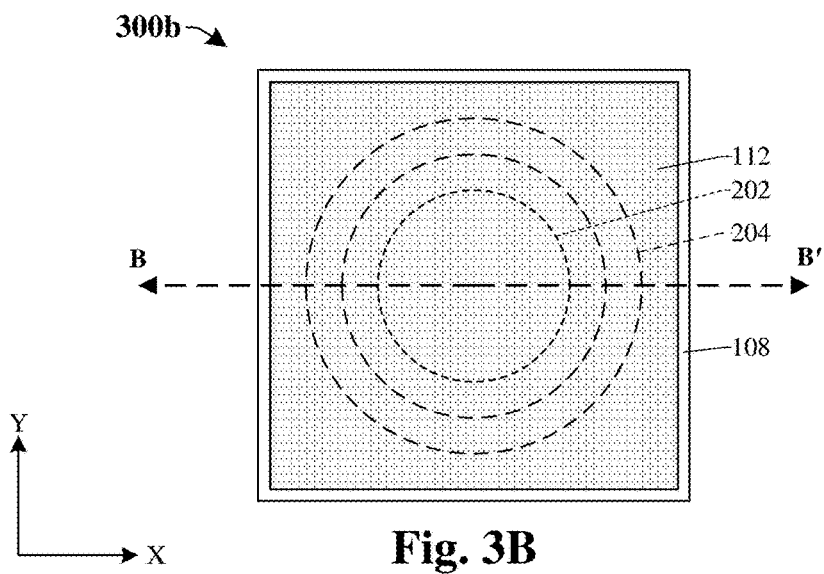
Figure 3C:
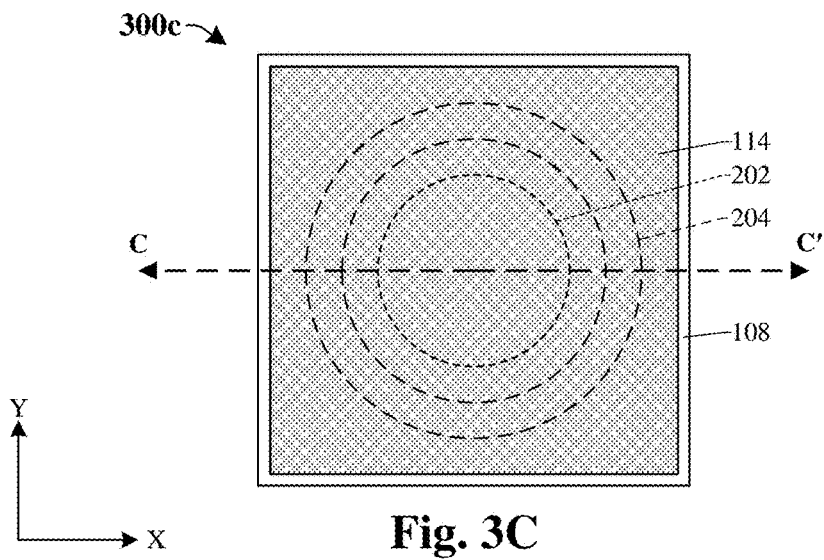

FIGS. 3A-3C illustrate top views 300a-300c of some embodiments of the integrated chip of FIG. 2. In some embodiments, the top views 300a-300c of FIGS. 3A-3C are illustrated in X-Y planes. In some embodiments, the top view 300a of FIG. 3A is taken across line A-A' of FIG. 2, the top view 300b of FIG. 3B is taken across line B-B' of FIG. 2, and the top view 300c of FIG. 3C is taken across line C-C' of FIG. 2.

In some embodiments (e.g., as shown in FIG. 3A), the first semiconductor region 202 has a round shape when viewed from above, the second semiconductor region 204 surrounds the first semiconductor region 202 in a ring shape, and a portion of the sensor semiconductor layer separates the first semiconductor region 202 from the second semiconductor region 204. The trench isolation structure 108 surrounds the photodetector 104 along a boundary of the pixel 102.

In some embodiments (e.g., as shown in FIG. 3B), the diffusion barrier structure 112 extends between sidewalls of the trench isolation structure 108 and over the sensor semiconductor layer 106. In some embodiments, the diffusion barrier structure 112 has a square shaped top view.

In some embodiments (e.g., as shown in FIG. 3C), the backside semiconductor layer 114 extends between sidewalls of the trench isolation structure 108 and over the diffusion barrier structure 112. In some embodiments, the backside semiconductor layer 114 has a square shaped top view.

Figure 3D:
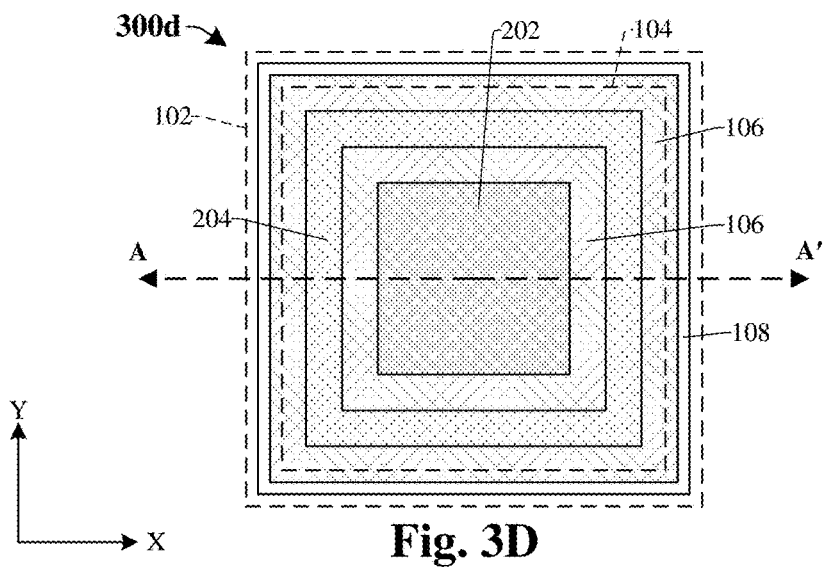
FIGS. 3D-3F illustrate top views of some other embodiments of the integrated chip of FIG. 2.
Figure 3E:
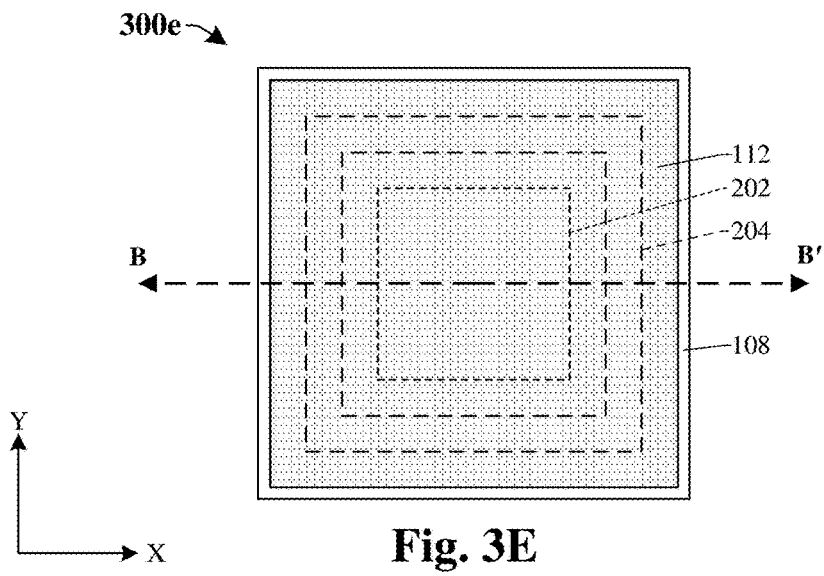
Figure 3F:
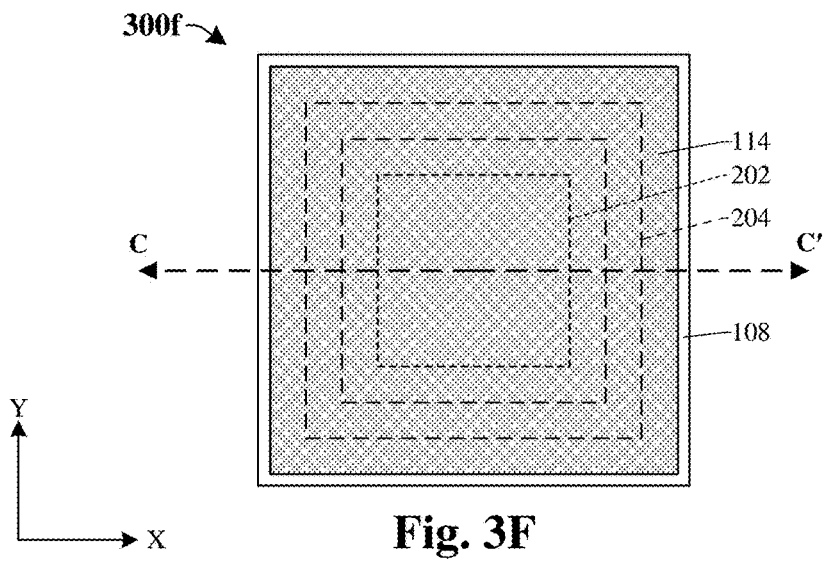

FIGS. 3D-3F illustrate top views 300d-300f of some other embodiments of the integrated chip of FIG. 2. In some embodiments, the top views 300d-300f of FIGS. 3D-3F are illustrated in X-Y planes. In some embodiments, the top view 300d of FIG. 3D is taken across line A-A' of FIG. 2, the top view 300e of FIG. 3E is taken across line B-B' of FIG. 2, and the top view 300f of FIG. 3F is taken across line C-C' of FIG. 2.

In some embodiments, the first semiconductor region 202 and/or the second semiconductor region 204 have square shapes when viewed in top view. For example, the first semiconductor region 202 may have a square shape when viewed in top view and the second semiconductor region 204 may have a square-ring shape when viewed in top view.

Figure 4:
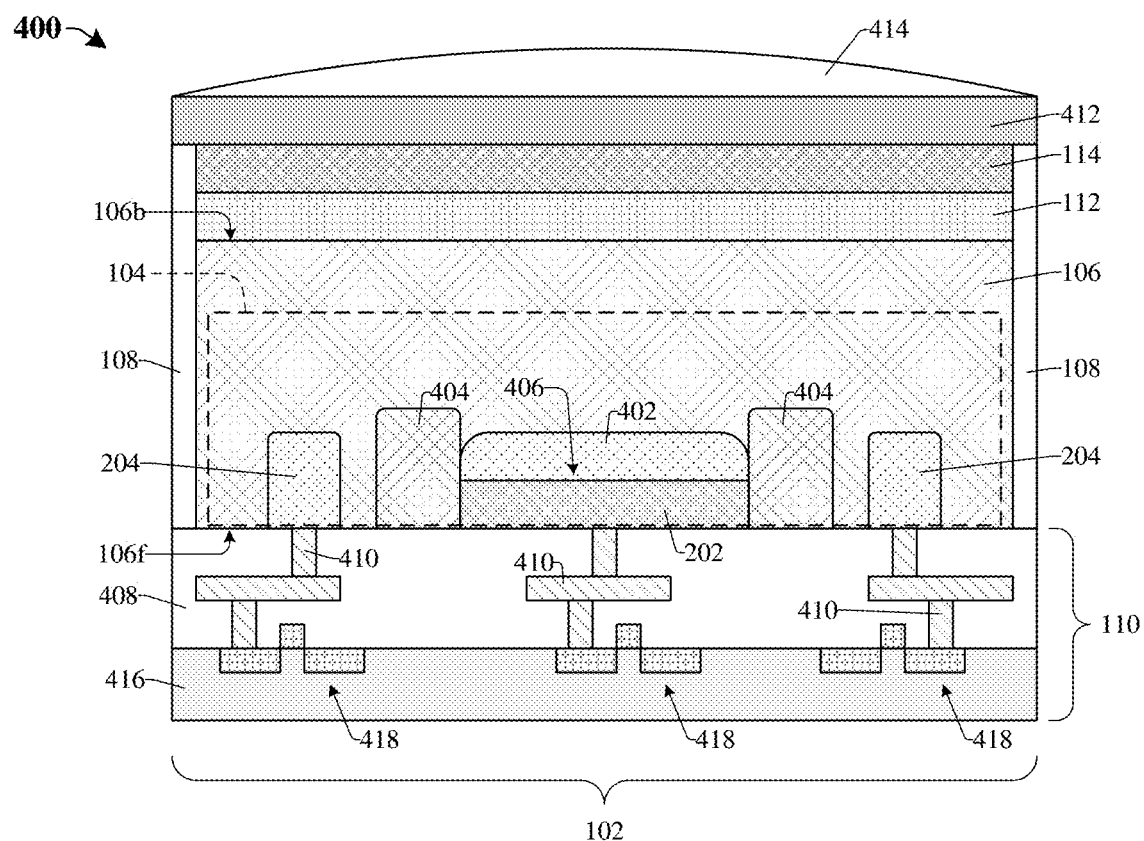
FIG. 4 illustrates a cross-sectional view of some embodiments of the integrated chip of FIG. 2 in which the integrated chip further comprises a third semiconductor region and a fourth semiconductor region.

FIG. 4 illustrates a cross-sectional view 400 of some embodiments of the integrated chip of FIG. 2 in which the integrated chip further comprises a third semiconductor region 402 and a fourth semiconductor region 404.

The third semiconductor region 402 and the fourth semiconductor region 404 are within the sensor semiconductor layer 106 along the frontside 106f of the sensor semiconductor layer 106. The third semiconductor region 402 is directly over the first semiconductor region 202. The fourth semiconductor region 404 laterally surrounds the first semiconductor region 202 and the third semiconductor region 402 (e.g., in a ring shape). In some embodiments, the third semiconductor region 402 and the fourth semiconductor region 404 are separately doped regions of the sensor semiconductor layer 106. In some embodiments, the third semiconductor region 402 has the first doping type (e.g., p-type), and the fourth semiconductor region 404 has the second doping type (e.g., n-type).

In some embodiments, the first semiconductor region 202, the second semiconductor region 204, the third semiconductor region 402, the fourth semiconductor region 404, and the sensor semiconductor layer 106 form the photodetector 104. For example, the first semiconductor region 202 and the third semiconductor region 402 form a p-n junction along an interface 406 between the first semiconductor region 202 and the third semiconductor region 402. In some embodiments, the fourth semiconductor region 404 forms a guard ring around first semiconductor region 202 and the third semiconductor region 402.

In some embodiments, the logic device wafer 110 comprises a device substrate 416, a plurality of transistor devices 418 along the device substrate 416, and a plurality of conductive wires 410 within a dielectric structure 408 over the device substrate 416. In some embodiments, the dielectric structure 408 is along the frontside 106f of the sensor semiconductor layer 106. For example, the dielectric structure 408 may comprise a plurality of dielectric layers. In some embodiments, the conductive wires 410 may, for example, be or comprise metal vias, metal lines, some other suitable interconnect, or the like and may be coupled to the photodetector 104.

In some embodiments, the integrated chip further includes a color filter 412 over the backside semiconductor layer 114 and micro lens 414 over the color filter 412. Photons may enter the pixel 102 through the micro lens 414 and the color filter 412, which are on the backside 106b of the sensor semiconductor layer 106. Thus, the image sensor may be referred to as being backside illuminated. It is understood that some elements, such as grid structures and shield structures may be included in the integrated chip, but may be omitted in the drawings.

Figure 5:
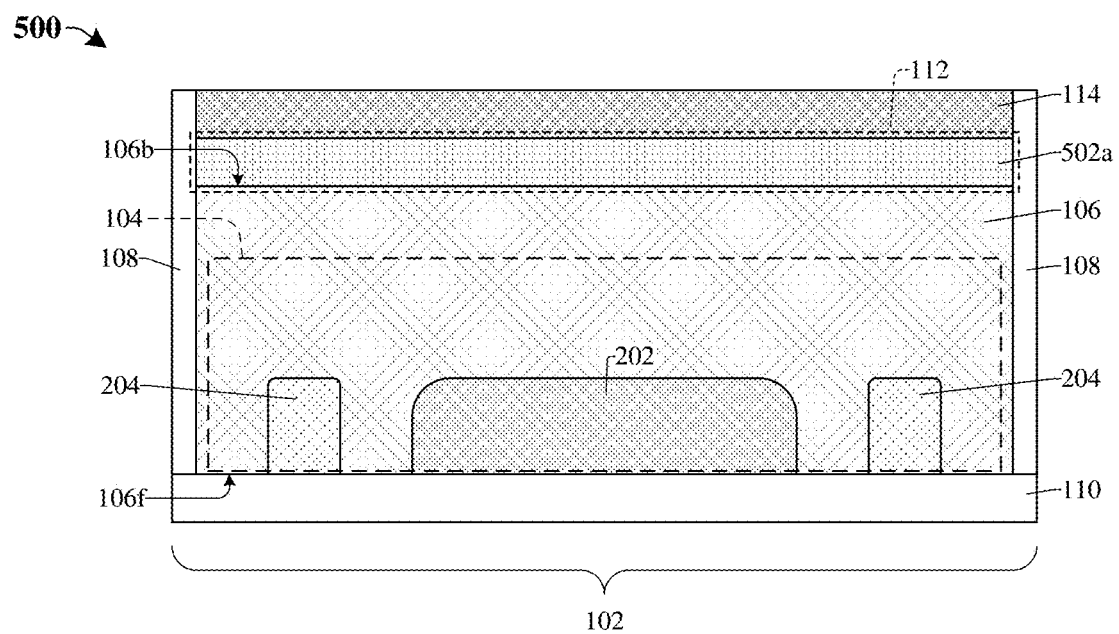
FIG. 5 illustrates a cross-sectional view of some embodiments of the integrated chip of FIG. 2 in which the diffusion barrier structure comprises a first diffusion barrier layer.

FIG. 5 illustrates a cross-sectional view 500 of some embodiments of the integrated chip of FIG. 2 in which the diffusion barrier structure 112 comprises a first diffusion barrier layer 502a.

The first diffusion barrier layer 502a is on a top surface of the sensor semiconductor layer 106 and the backside semiconductor layer 114 is on a top surface of the first diffusion barrier layer 502a. The first diffusion barrier layer 502a is in contact with both the sensor semiconductor layer 106 and the backside semiconductor layer 114.

In some embodiments, the first diffusion barrier layer 502a comprises a semiconductor such as, for example, silicon or some other suitable semiconductor material doped with oxygen, carbon, some other suitable dopant, or any combination of the foregoing. In some embodiments where the first diffusion barrier layer 502a comprises oxygen, an oxygen concentration of the first diffusion barrier layer 502a is about $1 \times 10^{20}$ to $10 \times 10^{20}$ cm$^{-3}$. In some embodiments where the first diffusion barrier layer 502a comprises carbon, a carbon concentration of the first diffusion barrier layer 502a is about $0.1 \times 10^{20}$ to $10 \times 10^{20}$ cm$^{-3}$. In some embodiments, the first diffusion barrier layer 502a has a thickness of greater than about 5 nanometers, a thickness of about 5 to 15 nanometers, a thickness of about 10 nanometers, or some other suitable thickness.

Figure 6:
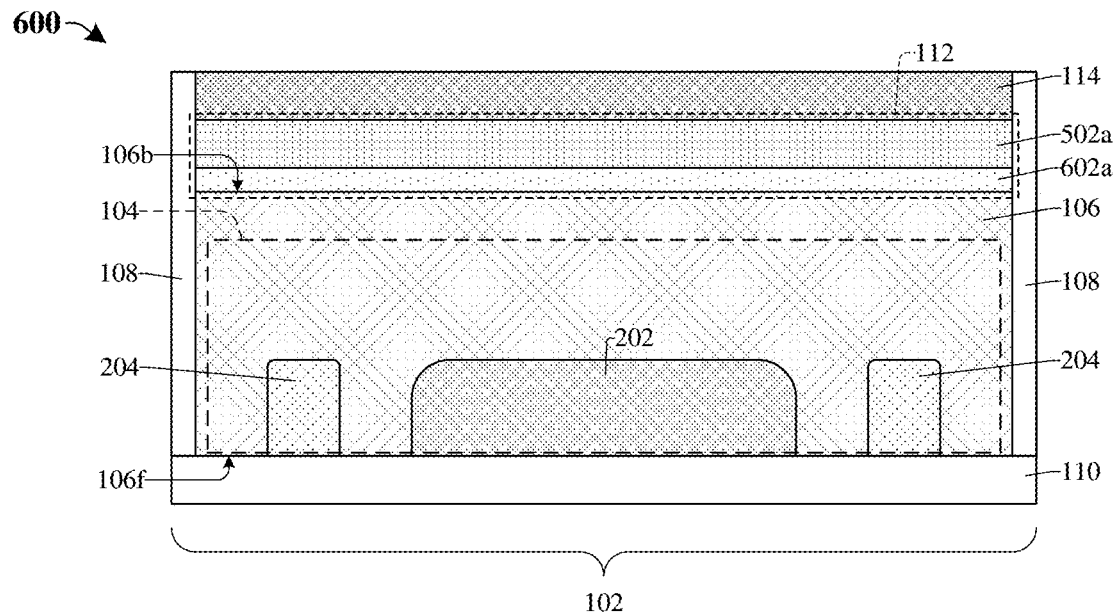
FIG. 6 illustrates a cross-sectional view of some embodiments of the integrated chip of FIG. 5 in which the diffusion barrier structure further comprises a first spacer layer between the first diffusion barrier layer and the sensor semiconductor layer.

FIG. 6 illustrates a cross-sectional view 600 of some embodiments of the integrated chip of FIG. 5 in which the diffusion barrier structure 112 further comprises a first spacer layer 602a between the first diffusion barrier layer 502a and the sensor semiconductor layer 106.

The first spacer layer 602a is on a top surface of the sensor semiconductor layer 106, the first diffusion barrier layer 502a is on a top surface of the first spacer layer 602a, and the backside semiconductor layer 114 is on a top surface of the first diffusion barrier layer 502a. The first spacer layer 602a separates the first diffusion barrier layer 502a from the sensor semiconductor layer 106.

In some embodiments, the first spacer layer 602a may, for example, comprise silicon or some other suitable material doped with boron, carbon, or some other suitable dopant. In some embodiments, the first spacer layer 602a has thickness of about 10 to 20 angstroms or some other suitable thickness.

Figure 7:
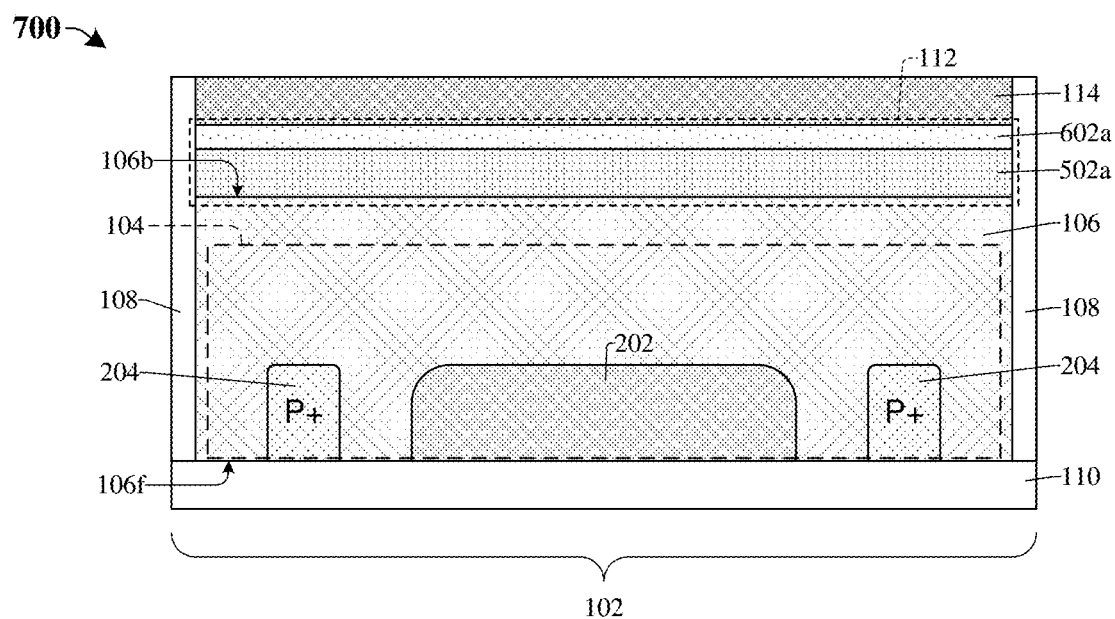
FIG. 7 illustrates a cross-sectional view of some embodiments of the integrated chip of FIG. 6 in which the first spacer layer is arranged between the first diffusion barrier layer and the backside semiconductor layer.

FIG. 7 illustrates a cross-sectional view 700 of some embodiments of the integrated chip of FIG. 6 in which the first spacer layer 602a is arranged between the first diffusion barrier layer 502a and the backside semiconductor layer 114.

The first diffusion barrier layer 502a is on a top surface of the sensor semiconductor layer 106, the first spacer layer 602a is on a top surface of the first diffusion barrier layer 502a, and the backside semiconductor layer 114 is on a top surface of the first spacer layer 602a. The first spacer layer 602a separates the first diffusion barrier layer 502a from the backside semiconductor layer 114.

Figure 8:
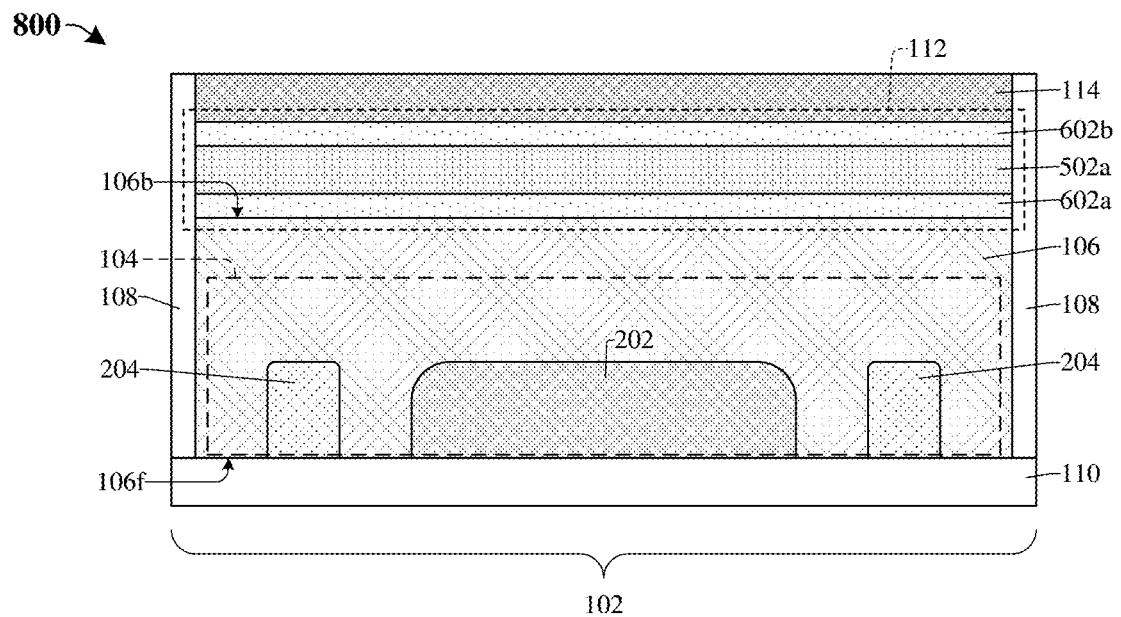
FIG. 8 illustrates a cross-sectional view of some embodiments of the integrated chip of FIG. 6 in which the diffusion barrier structure further comprises a second spacer layer.

FIG. 8 illustrates a cross-sectional view 800 of some embodiments of the integrated chip of FIG. 6 in which the diffusion barrier structure 112 further comprises a second spacer layer 602b.

In some embodiments, the first spacer layer 602a is between the sensor semiconductor layer 106 and the first diffusion barrier layer 502a, and the second spacer layer 602b is between the first diffusion barrier layer 502a and the backside semiconductor layer 114. The first spacer layer 602a is on a top surface of the sensor semiconductor layer 106, the first diffusion barrier layer 502a is on a top surface of the first spacer layer 602a, the second spacer layer 602b is on a top surface of the first diffusion barrier layer 502a, and the backside semiconductor layer 114 is on a top surface of the second spacer layer 602b. The first spacer layer 602a separates the first diffusion barrier layer 502a from the sensor semiconductor layer 106 and the second spacer layer 602b separates the first diffusion barrier layer 502a from the backside semiconductor layer 114.

In some embodiments, the second spacer layer 602b may, for example, comprise silicon or some other suitable material doped with boron, carbon, or some other suitable dopant. In some embodiments, the second spacer layer 602b has thickness of about 10 to 20 angstroms or some other suitable thickness.

In some embodiments, by including the first spacer layer 602a and/or the second spacer layer 602b in the diffusion barrier structure 112, a diffusion of the second dopant from the backside semiconductor layer 114 to the sensor semiconductor layer 106 may be further reduced. For example, in some embodiments where the first spacer layer 602a and/or the second spacer layer 602b comprise carbon, the carbon may further reduce, block, or trap interstitial defects or the like. Thus, a performance of the image sensor may be further improved.

Figure 9:
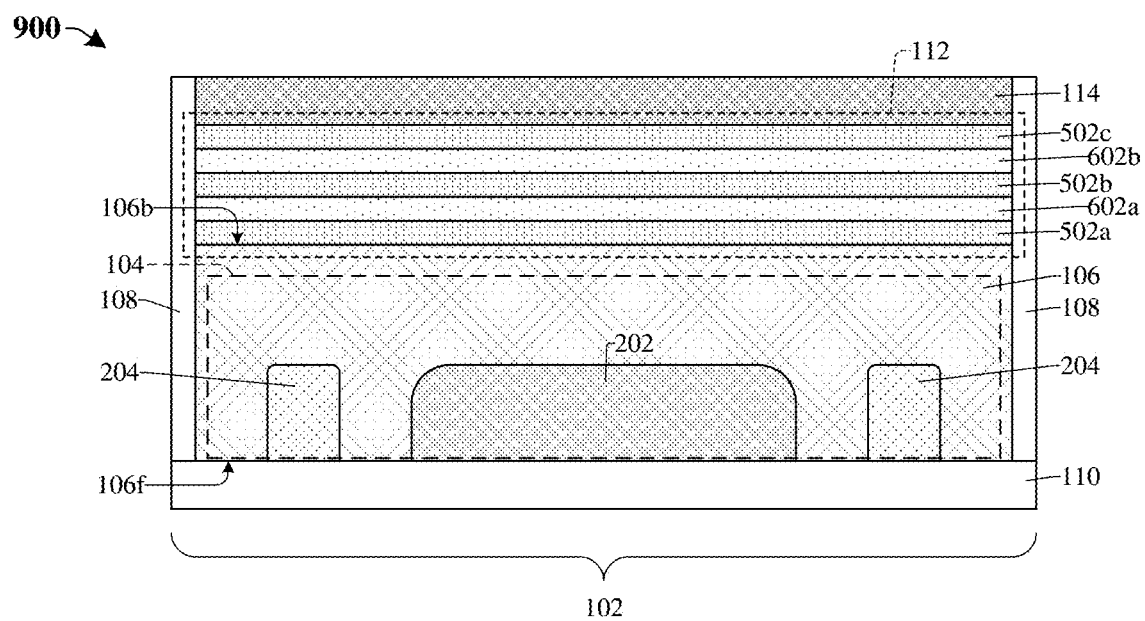
FIG. 9 illustrates a cross-sectional view of some embodiments of the integrated chip of FIG. 2 in which the diffusion barrier structure comprises a plurality of diffusion barrier layers.

FIG. 9 illustrates a cross-sectional view 900 of some embodiments of the integrated chip of FIG. 2 in which the diffusion barrier structure 112 comprises a plurality of diffusion barrier layers.

For example, in some embodiments, the diffusion barrier structure 112 comprises a first diffusion barrier layer 502a, a second diffusion barrier layer 502b, a third diffusion barrier layer 502c, a first spacer layer 602a, and a second spacer layer 602b. In some embodiments, the first spacer layer 602a is between the first diffusion barrier layer 502a and the second diffusion barrier layer 502b, and the second spacer layer 602b is between the second diffusion barrier layer 502b and the third diffusion barrier layer 502c.

In some embodiments, the first diffusion barrier layer 502a is on a top surface of the sensor semiconductor layer 106, the first spacer layer 602a is on a top surface of the first diffusion barrier layer 502a, the second diffusion barrier layer 502b is on a top surface of the first spacer layer 602a, the second spacer layer 602b is on a top surface of the second diffusion barrier layer 502b, the third diffusion barrier layer 502c is on a top surface of the second spacer layer 602b, and the backside semiconductor layer 114 is on a top surface of the third diffusion barrier layer 502c.

In some embodiments, the diffusion barrier layers 502a-502c each have a thickness of about 5 to 15 angstroms, about 10 angstroms, or some other suitable thickness.

In some embodiments, by including a plurality of diffusion barrier layers in the diffusion barrier structure 112, a diffusion of the second dopant from the backside semiconductor layer 114 to the sensor semiconductor layer 106 may be further reduced. For example, increasing a number of diffusion barrier layers in the diffusion barrier structure 112 may result in a greater reduction of interstitial defects or the like. Thus, a performance of the image sensor may be further improved.

Figure 10:
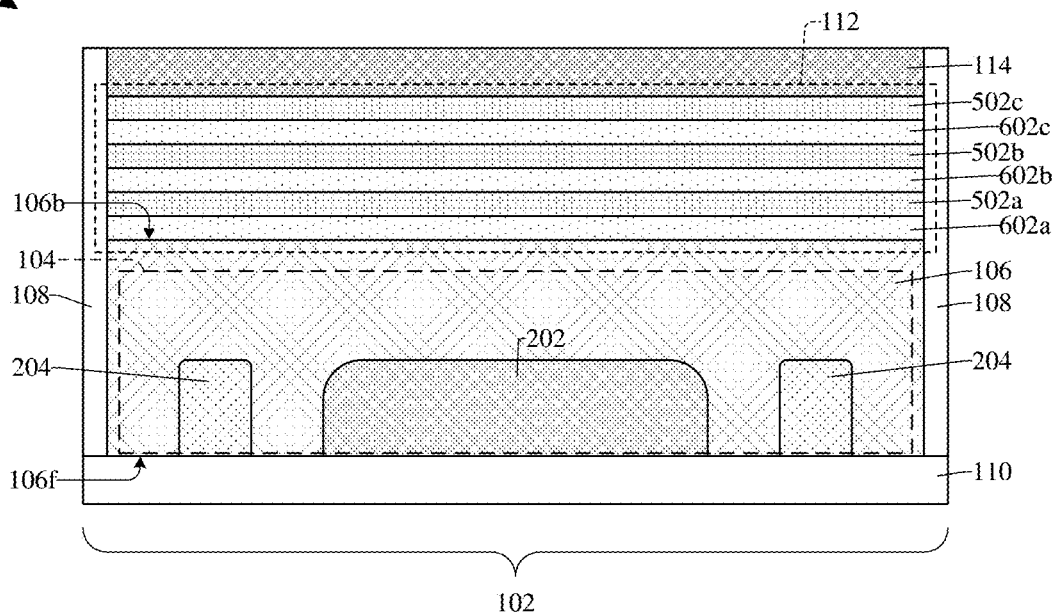
FIG. 10 illustrates a cross-sectional view of some embodiments of the integrated chip of FIG. 9 in which the diffusion barrier structure further comprises a spacer layer between the plurality of diffusion barrier layers and the sensor semiconductor layer.

FIG. 10 illustrates a cross-sectional view 1000 of some embodiments of the integrated chip of FIG. 9 in which the diffusion barrier structure 112 further comprises a spacer layer (e.g., 602a) between the plurality of diffusion barrier layers and the sensor semiconductor layer 106.

In some embodiments, the first spacer layer 602a is between the first diffusion barrier layer 502a and the sensor semiconductor layer 106, the second spacer layer 602b is between the first diffusion barrier layer 502a and the second diffusion barrier layer 502b, and a third spacer layer 602c is between the second diffusion barrier layer 502b and the third diffusion barrier layer 502c.

Figure 11:
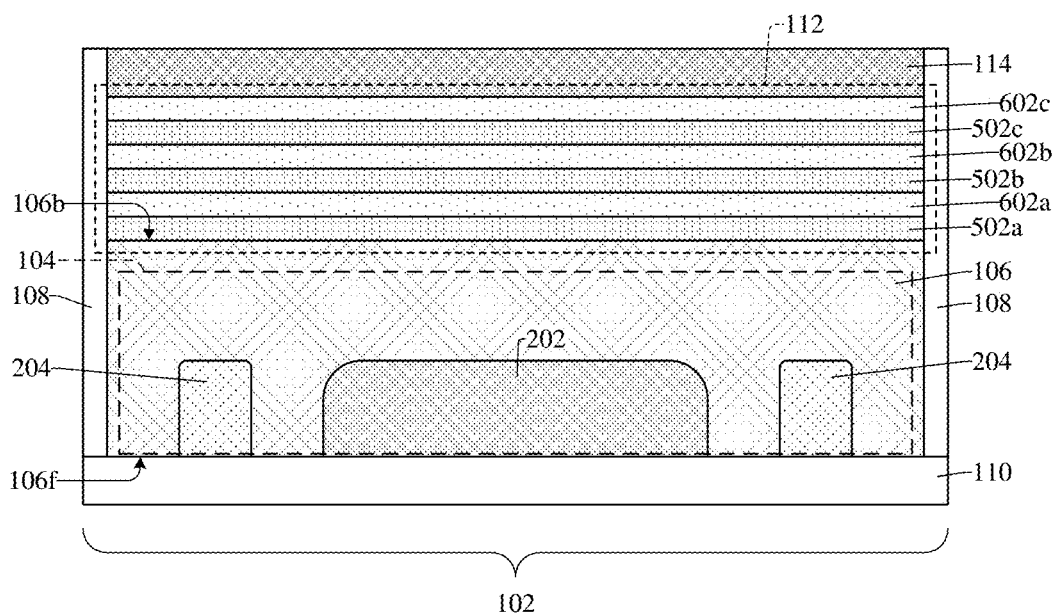
FIG. 11 illustrates a cross-sectional view of some embodiments of the integrated chip of FIG. 9 in which the diffusion barrier structure further comprises a spacer layer between the plurality of diffusion barrier layers and the backside semiconductor layer.

FIG. 11 illustrates a cross-sectional view 1100 of some embodiments of the integrated chip of FIG. 9 in which the diffusion barrier structure 112 further comprises a spacer layer (e.g., 602c) between the plurality of diffusion barrier layers and the backside semiconductor layer 114.

In some embodiments, the first spacer layer 602a is between the first diffusion barrier layer 502a and the second diffusion barrier layer 502b, the second spacer layer 602b is between the second diffusion barrier layer 502b and the third diffusion barrier layer 502c, and the third spacer layer 602c is between the third diffusion barrier layer 502c and the backside semiconductor layer 114.

Figure 12:
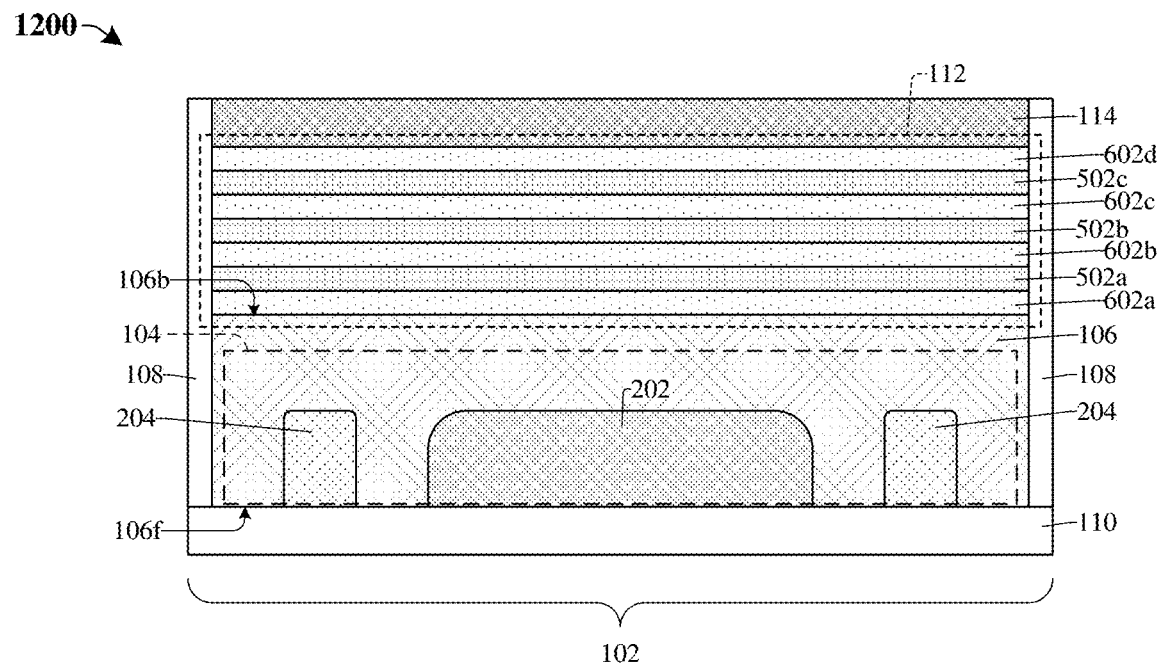
FIG. 12 illustrates a cross-sectional view of some embodiments of the integrated chip of FIG. 9 in which the diffusion barrier structure further comprises a spacer layer between the plurality of diffusion barrier layers and the sensor semiconductor layer and another spacer layer between the plurality of diffusion barrier layers and the backside semiconductor layer.

FIG. 12 illustrates a cross-sectional view 1200 of some embodiments of the integrated chip of FIG. 9 in which the diffusion barrier structure 112 further comprises a spacer layer (e.g., 602a) between the plurality of diffusion barrier layers and the sensor semiconductor layer 106 and another spacer layer (e.g., 602d) between the plurality of diffusion barrier layers and the backside semiconductor layer 114.

In some embodiments, the first spacer layer 602a is between the first diffusion barrier layer 502a and the sensor semiconductor layer 106, the second spacer layer 602b is between the first diffusion barrier layer 502a and the second diffusion barrier layer 502b, the third spacer layer 602c is between the second diffusion barrier layer 502b and the third diffusion barrier layer 502c, and a fourth spacer layer 602d is between the third diffusion barrier layer 502c and the backside semiconductor layer 114.

Figure 13:
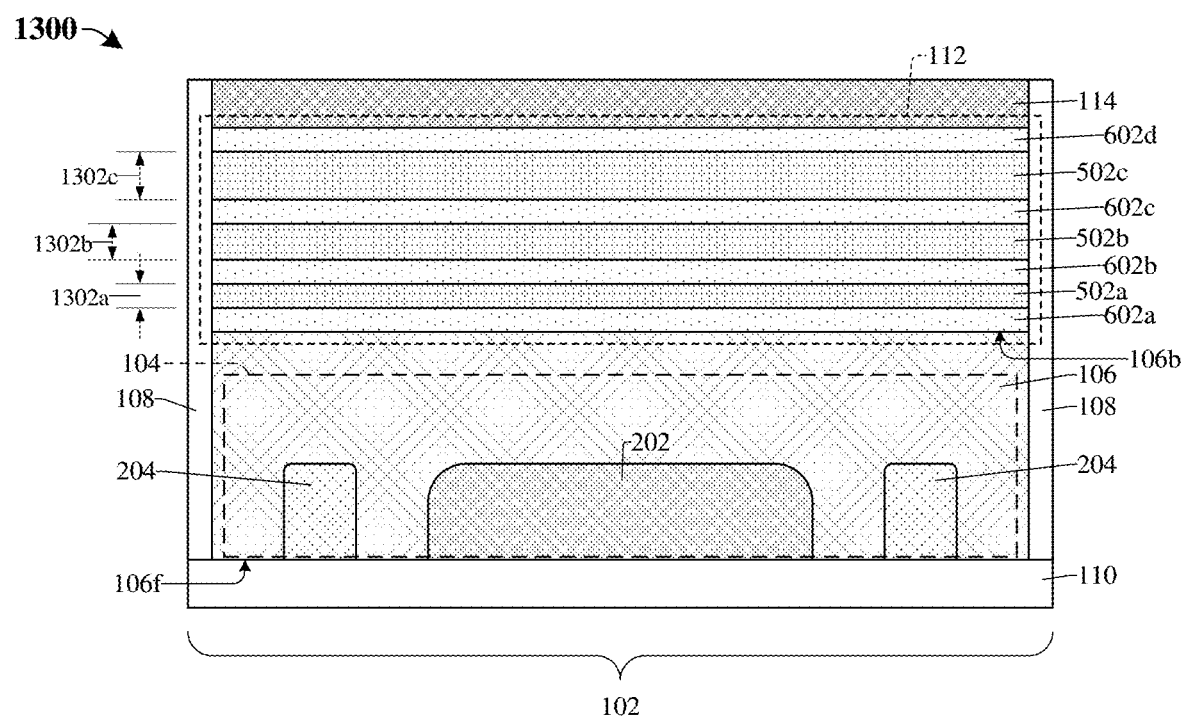
FIG. 13 illustrates a cross-sectional view of some embodiments of the integrated chip of FIG. 9 in which the diffusion barrier layers of the diffusion barrier structure have varying thicknesses.

FIG. 13 illustrates a cross-sectional view 1300 of some embodiments of the integrated chip of FIG. 9 in which the diffusion barrier layers of the diffusion barrier structure 112 have varying thicknesses.

In some embodiments, the plurality of diffusion barrier layers have different thicknesses. For example, in some embodiments, the first diffusion barrier layer 502a has a first thickness 1302a, the second diffusion barrier layer 502b has a second thickness 1302b different from the first thickness 1302a, and the third diffusion barrier layer 502c has a third thickness 1302c different form the first thickness 1302a and the second thickness 1302b.

In some embodiments, the thicknesses of the diffusion barrier layers decrease with the depth of the image sensor from a backside of the image sensor. For example, in some embodiments, the third thickness 1302c is greater than the second thickness 1302b, and the second thickness 1302b is greater than the first thickness 1302a.

In some other embodiments, the thicknesses of the diffusion barrier layers increase with the depth of the image sensor. For example, in some embodiments, the third thickness 1302c is less than the second thickness 1302b, and the second thickness 1302b is less than the first thickness 1302a.

In some embodiments, the thicknesses of the diffusion barrier layers may vary independently of the depth of the image sensor. For example, in some embodiments, the third thickness 1302c is less than the second thickness 1302b, the second thickness 1302b is greater than the first thickness 1302a, and the first thickness 1302a is less than the third thickness 1302c.

Figure 19:
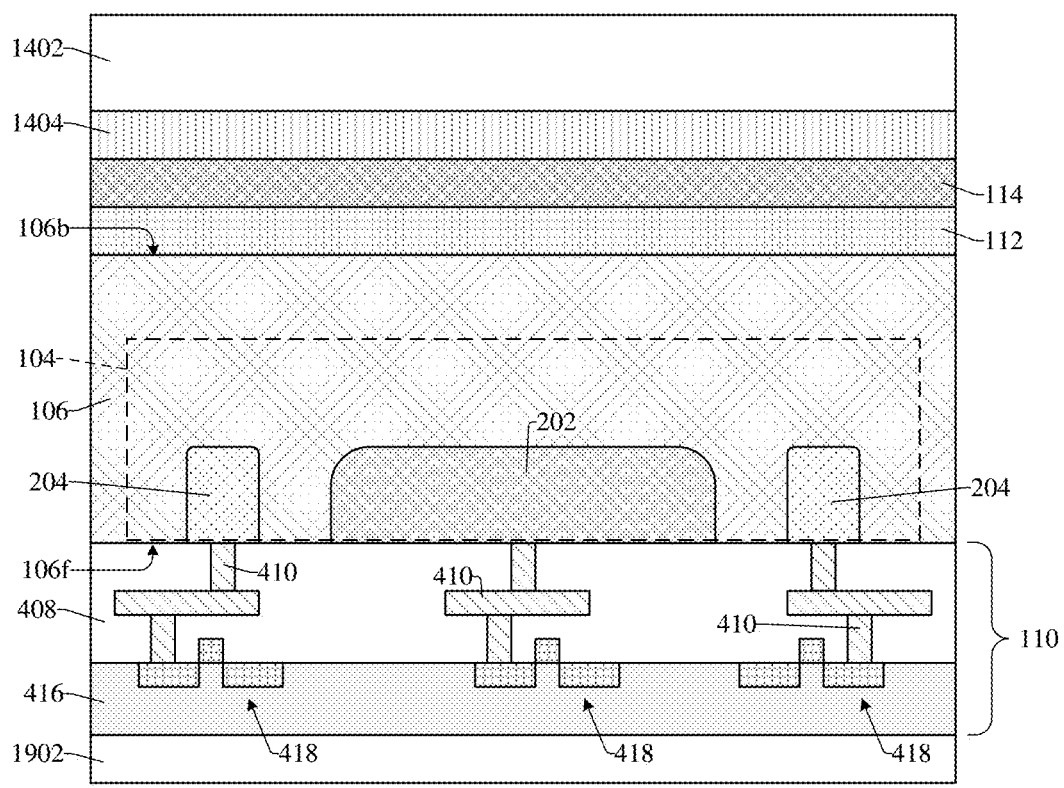
Figure 20:
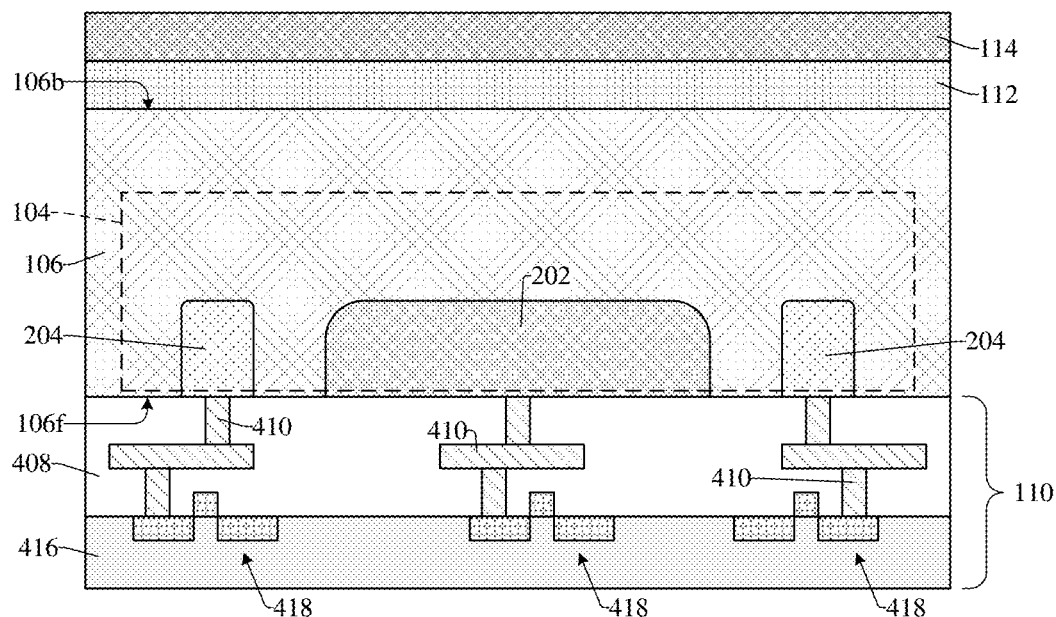
Figure 21:
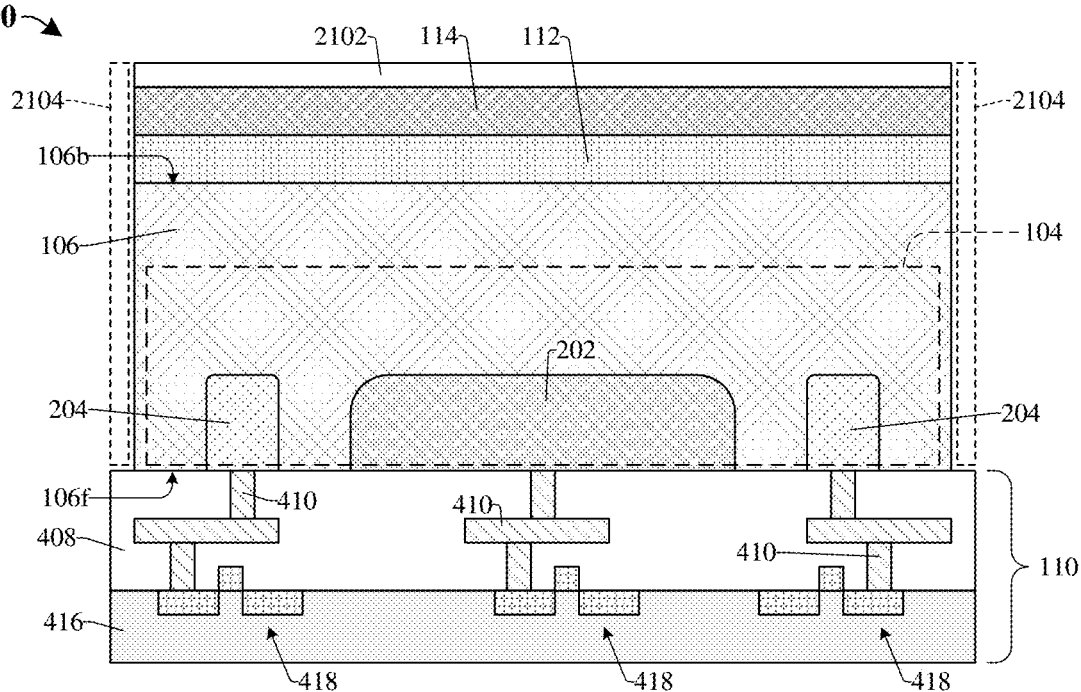
Figure 22:
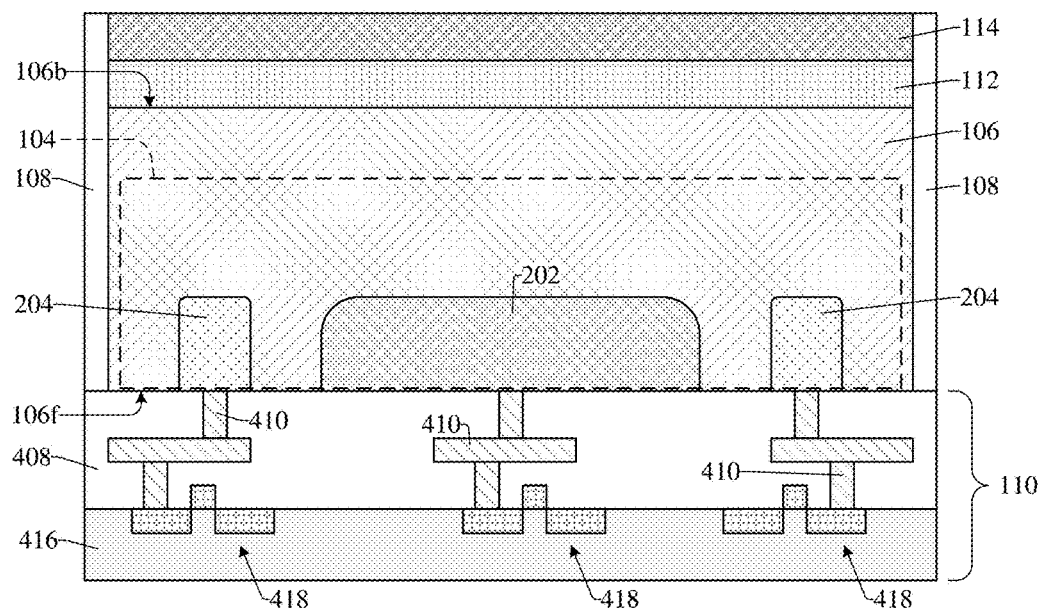
Figure 23:
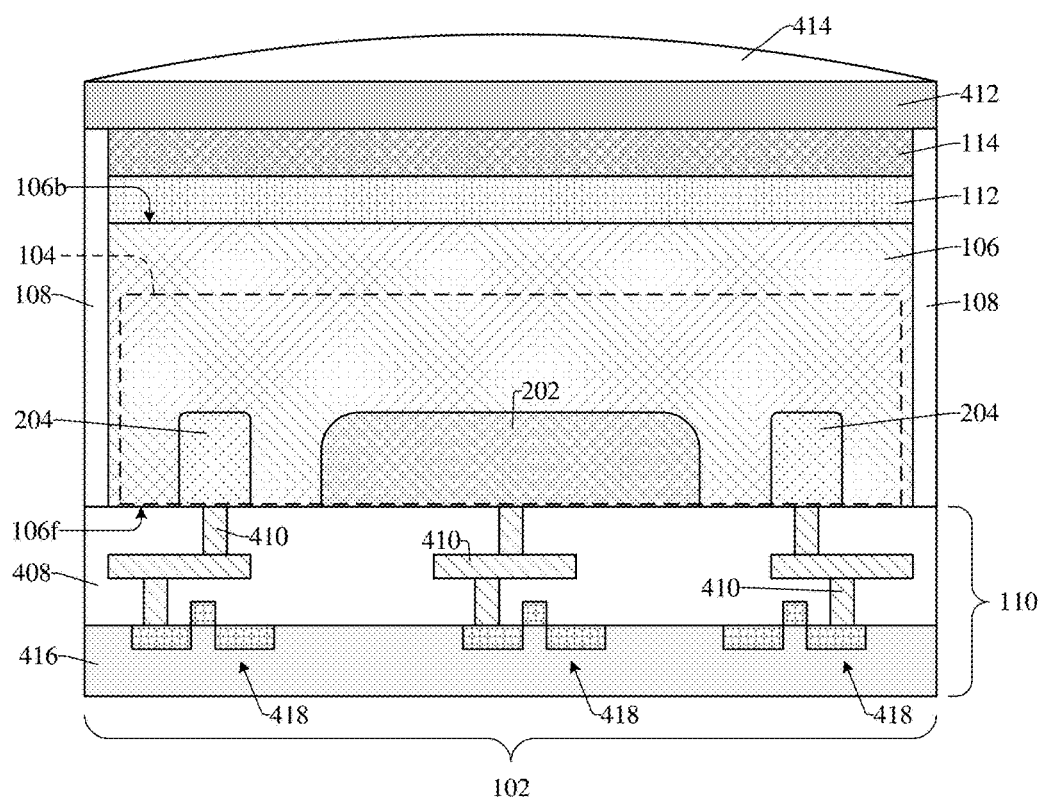

FIGS. 14-23 illustrate cross-sectional views 1400-2300 of some embodiments of a method for forming an integrated chip comprising an image sensor, the image sensor comprising a diffusion barrier structure 112 between a sensor semiconductor layer 106 and a backside semiconductor layer 114. Although FIGS. 14-23 are described in relation to a method, it will be appreciated that the structures disclosed in FIGS. 21-23 are not limited to such a method, but instead may stand alone as structures independent of the method.

Figure 14:
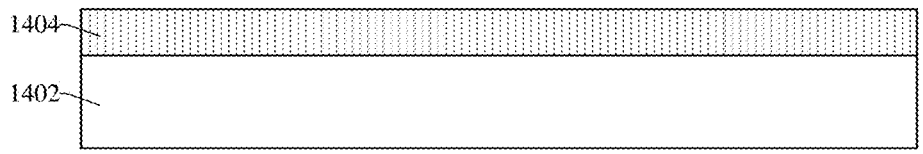
FIGS. 14-23 illustrate cross-sectional views of some embodiments of a method for forming an integrated chip comprising an image sensor, the image sensor comprising a diffusion barrier structure between a sensor semiconductor layer and a backside semiconductor layer.

As shown in cross-sectional view 1400 of FIG. 14, a base semiconductor layer 1404 is deposited on a substrate 1402. In some embodiments, the base semiconductor layer 1404 comprises silicon or some other suitable material(s) and is deposited on the substrate 1402 by an epitaxial growth process, a chemical vapor deposition (CVD) process, a physical vapor deposition (PVD) process, an atomic layer deposition (ALD) process, or some other suitable process.

In some embodiments, the base semiconductor layer 1404 has the first doping type (e.g., p-type). In some embodiments, a thickness of the base semiconductor layer 1404 is about 5 to 6 micrometers or some other suitable thickness. In some embodiments, the substrate 1402 comprises silicon or some other suitable material(s) and has the first doping type.

Figure 15:
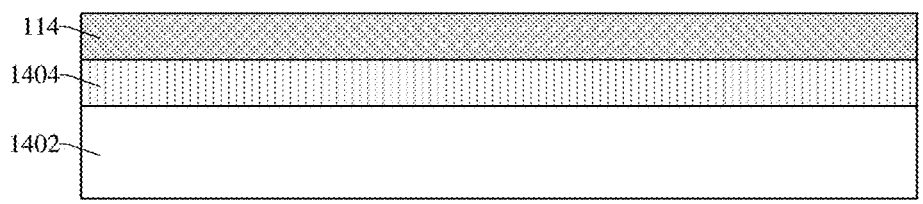

As shown in cross-sectional view 1500 of FIG. 15, a backside semiconductor layer 114 is deposited on the base semiconductor layer 1404. In some embodiments, the backside semiconductor layer 114 comprises boron doped silicon or some other suitable material and is deposited on the base semiconductor layer 1404 by an epitaxial growth process, a CVD process, a PVD process, an ALD process, or some other suitable process. In some other embodiments, the backside semiconductor layer 114 comprises boron and carbon doped silicon or some other suitable material and is deposited on the base semiconductor layer 1404 by an epitaxial growth process, a CVD process, a PVD process, an ALD process, or some other suitable process. In some such embodiments where the backside semiconductor layer 114 comprises a boron and carbon doped semiconductor, the backside semiconductor layer 114 may be formed using a monomethyl silane (MMS) (e.g., $SiH_3CH_3$) precursor during an epitaxial growth process.

Figure 16:
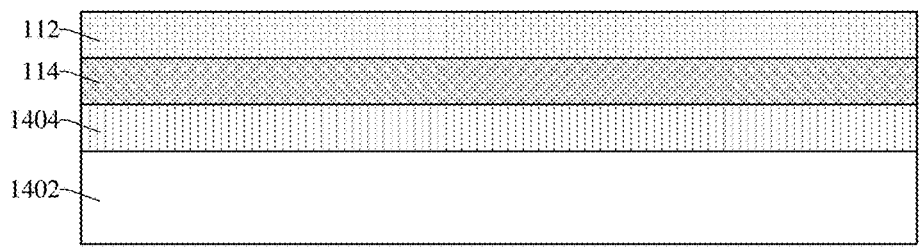

As shown in cross-sectional view 1600 of FIG. 16, a diffusion barrier structure 112 is formed on the backside semiconductor layer 114.

In some embodiments, forming the diffusion barrier structure 112 comprises depositing a diffusion barrier layer (e.g., 502a of FIGS. 5-8) over the backside semiconductor layer 114. In some embodiments, forming the diffusion barrier structure 112 further comprises depositing one or more spacer layers (e.g., 602a, 602b of FIGS. 6-8) over the backside semiconductor layer 114. In some other embodiments, forming the diffusion barrier structure 112 comprises depositing a plurality of diffusion barrier layers (e.g., 502a-502c of FIGS. 9-13) over the backside semiconductor layer 114 and depositing spacer layers (e.g., 602a, 602b, 602c, and/or 602d of FIGS. 6-13) therebetween in an alternating fashion.

In some embodiments, forming the diffusion barrier layer(s) comprises depositing a semiconductor (e.g., silicon or the like) doped with oxygen, a semiconductor doped with carbon, or some other suitable material over the backside semiconductor layer 114 by an epitaxial growth process, a CVD process, a PVD process, an ALD process, or some other suitable process. In some embodiments, forming the spacer layer(s) comprises depositing a semiconductor doped with boron, a semiconductor doped with carbon, or some other suitable material over the backside semiconductor layer 114 by an epitaxial growth process, a CVD process, a PVD process, an ALD process, or some other suitable process.

In some embodiments where the diffusion barrier layer(s) comprise oxygen, the diffusion barrier layer(s) may be formed using a hydrogen-oxygen precursor and dichlorosilane (DCS) (e.g., $SiH_2Cl_2$) during an epitaxial growth process performed in an environment of about 500 to 700 degrees Celsius. In some embodiments where the diffusion barrier layer(s) comprise carbon, the diffusion barrier layer (s) may be formed using an MMS precursor during an epitaxial growth process.

Figure 17:
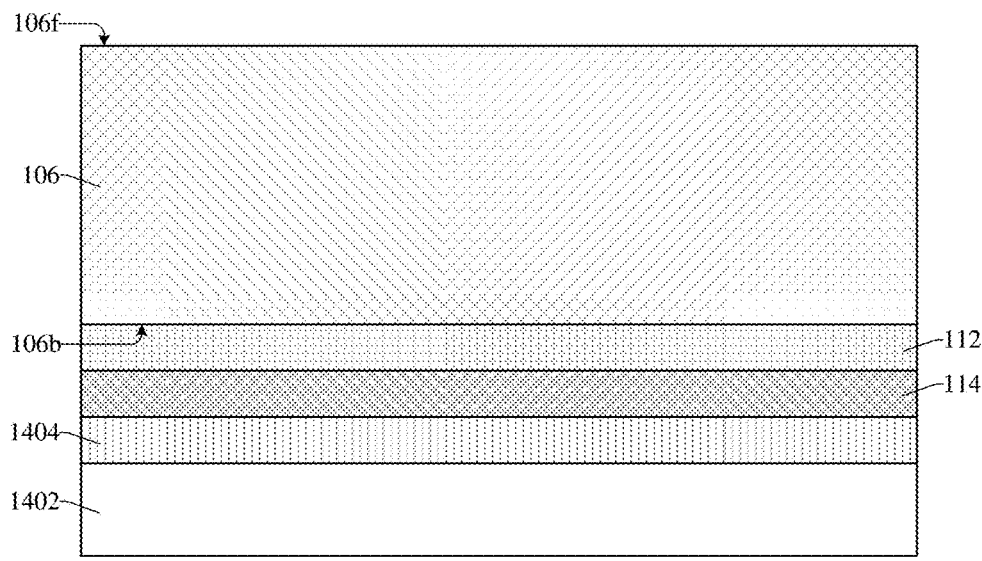

As shown in cross-sectional view 1700 of FIG. 17, a sensor semiconductor layer 106 is deposited on the diffusion barrier structure 112. In some embodiments, the sensor semiconductor layer 106 comprises boron doped silicon or some other suitable material and is deposited on the diffusion barrier structure 112 by an epitaxial growth process, a CVD process, a PVD process, an ALD process, or some other suitable process.

In some embodiments, the sensor semiconductor layer 106 is deposited on a diffusion barrier layer (e.g., 502a, 502b, or 502c) of the diffusion barrier structure 112. In some other embodiments, the sensor semiconductor layer 106 is deposited on a spacer layer (e.g., 602a, 602b, 602c, or 602d) of the diffusion barrier structure 112.

In some embodiments, any of the base semiconductor layer 1404, the backside semiconductor layer 114, the diffusion barrier structure 112, and the sensor semiconductor layer 106 may be formed in a low pressure environment, an atmospheric pressure environment, or some other suitable environment.

Figure 18:
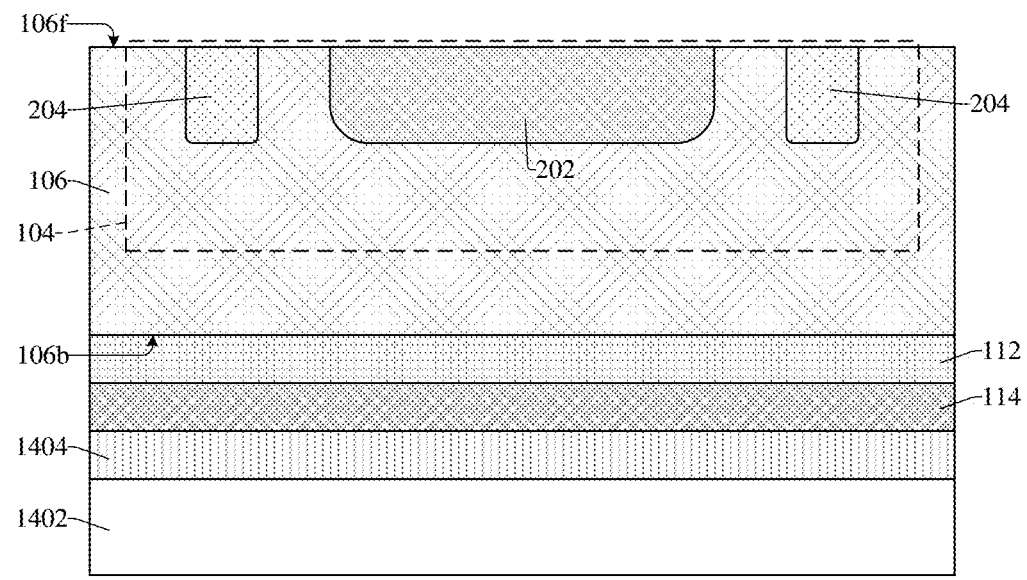

As shown in cross-sectional view 1800 of FIG. 18, a photodetector 104 is formed in the sensor semiconductor layer 106 along a frontside 106f of the sensor semiconductor layer 106. In some embodiments, forming the photodetector 104 comprises forming a first semiconductor region 202 and a second semiconductor region 204 in the sensor semiconductor layer 106. In some embodiments, forming the photodetector 104 further comprises forming a third semiconductor region (e.g., 402 of FIG. 4) and a fourth semiconductor region (e.g., 404 of FIG. 4) in the sensor semiconductor layer 106. In some embodiments, the semiconductor regions (e.g., 202, 204, 402, 404) are formed by doping portions of the sensor semiconductor layer 106 by way of, for example, one or more ion implantation processes or some other suitable process(es).

As shown in cross-sectional view 1900 of FIG. 19, the integrated chip is rotated such that the backside 106b of the sensor semiconductor layer 106 is over the frontside 106f. A logic device wafer 110 is then bonded to sensor semiconductor layer 106 along the frontside 106f of the sensor semiconductor layer 106. In some embodiments, the logic device wafer 110 comprises a plurality of transistor devices 418 arranged along a device substrate 416 and a plurality of conductive wires 410 within a dielectric structure 408 over the device substrate 416. In some embodiments, the logic device wafer 110 is on a carrier wafer 1902. In some embodiments, the logic device wafer 110 is bonded to the sensor semiconductor layer 106 by an adhesive bonding process, a direct bonding process, a surface activated bonding process, a plasma activated bonding process, or some other suitable process(es). In some embodiments, the carrier wafer 1902 may be separated from the logic device wafer 110 after the bonding.

As shown in cross-sectional view 2000 of FIG. 20, the substrate 1402 is removed from over the base semiconductor layer 1404. Further, the base semiconductor layer 1404 is removed from over the backside semiconductor layer 114. In some embodiments, removing the substrate 1402 and the base semiconductor layer 1404 comprises a grinding process, a chemical mechanical planarization (CMP) process, a hydrofluoric-nitric-acetic (HNA) etching process, a tetramethylammonium hydroxide (TMAH) etching process, some other suitable process, or any combination of the foregoing.

As shown in cross-sectional view 2100 of FIG. 21, a masking layer 2102 is formed on the backside semiconductor layer 114. The backside semiconductor layer 114, the diffusion barrier structure 112, and the sensor semiconductor layer 106 are then patterned according to the masking layer 2102 to form a trench 2104 in the backside semiconductor layer 114, the diffusion barrier structure 112, and the sensor semiconductor layer 106. The trench 2104 is on opposite sides of the backside semiconductor layer 114, the diffusion barrier structure 112, and the sensor semiconductor layer 106. In some embodiments, the patterning comprises a dry etching process such as, for example, a plasma etching process, a reactive ion etching (RIE) process, an ion beam etching (IBE) process, or some other suitable process. In some embodiments, the masking layer 2102 may, for example, be a photoresist mask, a hard mask, or the like. In some embodiments, the masking layer 2102 is removed after the patterning.

As shown in cross-sectional view 2200 of FIG. 22, a trench isolation structure 108 is formed in the trench (e.g., 2104 of FIG. 21). In some embodiments, forming the trench isolation structure 108 comprises depositing a dielectric such as, for example, silicon dioxide, silicon nitride, or some other suitable material in the trench by a CVD process, a PVD process, an ALD process, or some other suitable process. In some embodiments, forming the trench isolation structure 108 further comprises a performing CMP or the like on the deposited dielectric.

As shown in cross-sectional view 2300 of FIG. 23, a color filter 412 may be formed over the backside semiconductor layer 114 and a micro lens 414 may be formed over the color filter 412.

Figure 24:
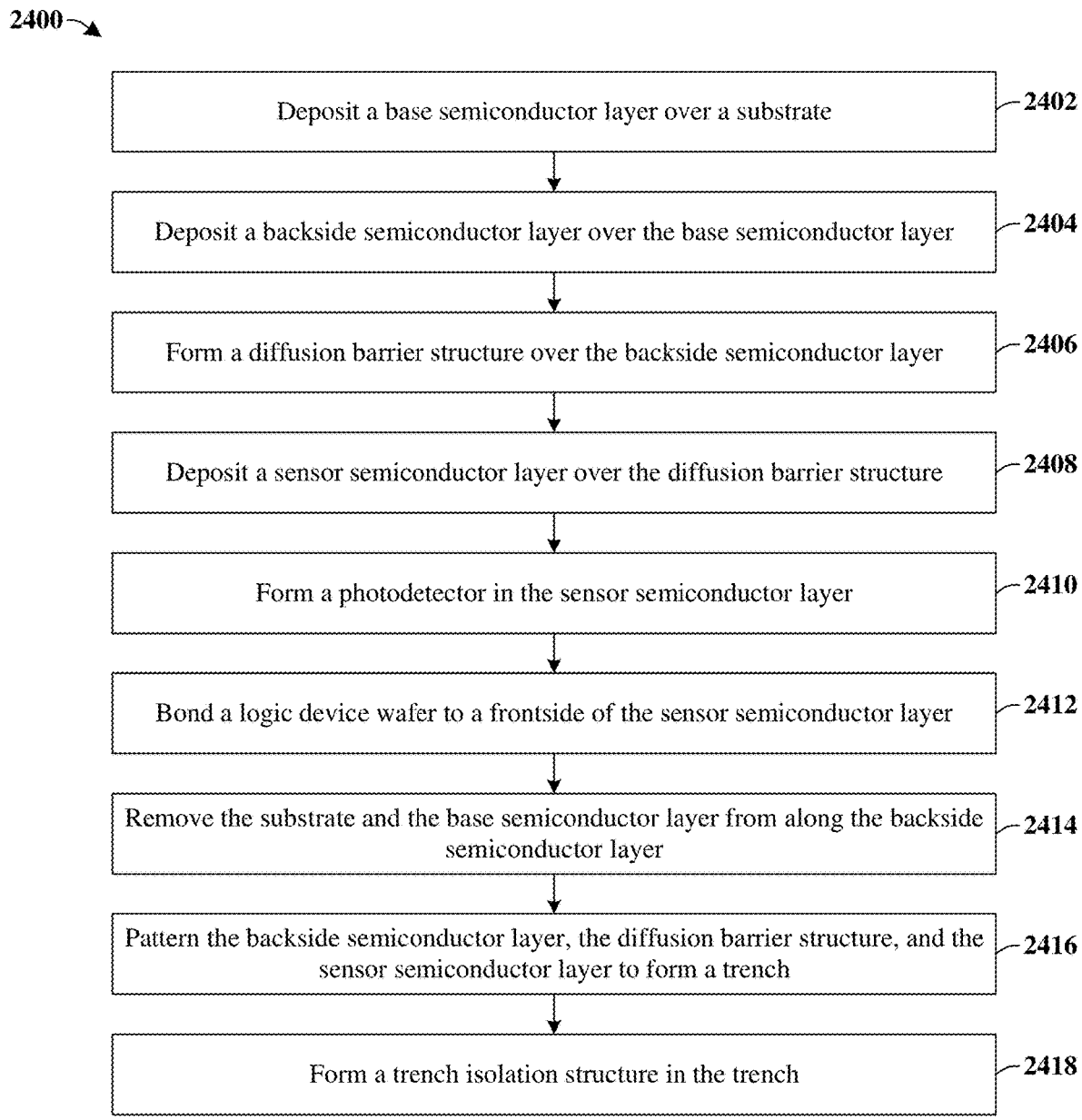
FIG. 24 illustrates a flow diagram of some embodiments of a method for forming an integrated chip comprising an image sensor, the image sensor comprising a diffusion barrier structure between a sensor semiconductor layer and a backside semiconductor layer.

FIG. 24 illustrates a flow diagram of some embodiments of a method 2400 for forming an integrated chip comprising an image sensor, the image sensor comprising a diffusion barrier structure between a sensor semiconductor layer and a backside semiconductor layer. While method 2400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2402, deposit a base semiconductor layer over a substrate. FIG. 14 illustrates a cross-sectional view 1400 of some embodiments corresponding to block 2402.

At 2404, deposit a backside semiconductor layer over the base semiconductor layer. FIG. 15 illustrates a cross-sectional view 1500 of some embodiments corresponding to block 2404.

At 2406, form a diffusion barrier structure over the backside semiconductor layer. For example, form one or more diffusion barrier layers and one or more spacer layers over the backside semiconductor layer. FIG. 16 illustrates a cross-sectional view 1600 of some embodiments corresponding to block 2406.

At 2408, deposit a sensor semiconductor layer over the diffusion barrier structure. FIG. 17 illustrates a cross-sectional view 1700 of some embodiments corresponding to block 2408.

At 2410, form a photodetector in the sensor semiconductor layer. FIG. 18 illustrates a cross-sectional view 1800 of some embodiments corresponding to block 2410.

At 2412, bond a logic device wafer to a frontside of the sensor semiconductor layer. FIG. 19 illustrates a cross-sectional view 1900 of some embodiments corresponding to block 2412.

At 2414, remove the substrate and the base semiconductor layer from along the backside semiconductor layer. FIG. 20 illustrates a cross-sectional view 2000 of some embodiments corresponding to block 2414.

At 2416, pattern the backside semiconductor layer, the diffusion barrier structure, and the sensor semiconductor layer to form a trench. FIG. 21 illustrates a cross-sectional view 2100 of some embodiments corresponding to block 2416.

At 2418, form a trench isolation structure in the trench. FIG. 22 illustrates a cross-sectional view 2200 of some embodiments corresponding to block 2418.

Thus, various embodiments of the present disclosure are related to an integrated chip and a method for forming the integrated chip, the integrated chip comprising an image sensor, the image sensor comprising a diffusion barrier structure between a sensor semiconductor layer and a backside semiconductor layer for reducing a diffusion of a dopant from the backside semiconductor layer into the sensor semiconductor layer.

Accordingly, in some embodiments, the present disclosure relates to an integrated chip. The integrated chip comprises a sensor semiconductor layer. The sensor semiconductor layer is doped with a first dopant. A photodetector is along a frontside of the sensor semiconductor layer. A backside semiconductor layer is along a backside of the sensor semiconductor layer, opposite the frontside. The backside semiconductor layer is doped with a second dopant. A diffusion barrier structure is between the sensor semiconductor layer and the backside semiconductor layer. The diffusion barrier structure comprises a third dopant different from the first dopant and the second dopant.

In other embodiments, the present disclosure relates to an integrated chip comprising a sensor semiconductor layer having a first doping type. The sensor semiconductor layer is doped with a first dopant and has a first dopant concentration. A photodetector is within the sensor semiconductor layer and arranged along a frontside of the sensor semiconductor layer. A backside semiconductor layer having the first doping type is over the sensor semiconductor layer and along a backside of the sensor semiconductor layer, opposite the frontside. The backside semiconductor layer is doped with a second dopant and has a second dopant concentration that is greater than the first dopant concentration. A first diffusion barrier layer is between the sensor semiconductor layer and the backside semiconductor layer. The first diffusion barrier layer comprises a semiconductor doped with a third dopant different from the first dopant and the second dopant.

In yet other embodiments, the present disclosure relates to a method for forming an integrated chip. The method comprises depositing a base semiconductor layer over a substrate. A backside semiconductor layer is deposited over the base semiconductor layer. The backside semiconductor layer has a first doping type. A diffusion barrier structure is formed over the backside semiconductor layer. A sensor semiconductor layer is deposited over the diffusion barrier structure. The sensor semiconductor layer has the first doping type. A photodetector is formed in the sensor semiconductor layer. The base semiconductor layer and the substrate are removed from along the backside semiconductor layer. The sensor semiconductor layer is doped with a first dopant and the backside semiconductor layer is doped with a second dopant. Further, forming the diffusion barrier structure comprises depositing a diffusion barrier layer comprising a semiconductor doped with a third dopant different from the first dopant and the second dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   depositing a base semiconductor layer over a substrate;
   depositing a backside semiconductor layer over the base semiconductor layer, wherein the backside semiconductor layer has a first doping type;
   forming a diffusion barrier structure over the backside semiconductor layer;
   depositing a sensor semiconductor layer over the diffusion barrier structure, wherein the sensor semiconductor layer has the first doping type;
   forming a photodetector in the sensor semiconductor layer; and
   removing the base semiconductor layer and the substrate from along the backside semiconductor layer,
   wherein the sensor semiconductor layer is doped with a first dopant and the backside semiconductor layer is doped with a second dopant, and wherein forming the diffusion barrier structure comprises depositing a plurality of diffusion barrier layers with a plurality of spacer layers arranged therebetween in an alternating fashion, the plurality of diffusion barrier layers comprising a semiconductor doped with a third dopant different from the first dopant and the second dopant.

2. The method of claim 1, wherein the third dopant is oxygen.

3. The method of claim 1, wherein the second dopant is the same as the first dopant.

4. The method of claim 3, wherein the backside semiconductor layer is doped with a fourth dopant different than the first dopant and the second dopant.

5. The method of claim 4, wherein the fourth dopant is different than the third dopant.

6. The method of claim 1, further comprising:
   bonding a device wafer along the sensor semiconductor layer.

7. A method for forming an integrated chip, the method comprising:
   depositing a first diffusion barrier layer over a backside semiconductor layer;
   depositing a sensor semiconductor layer over the first diffusion barrier layer; and
   forming a photodetector in the sensor semiconductor layer,
   wherein the sensor semiconductor layer comprises a first dopant, the backside semiconductor layer comprises a second dopant and a third dopant, and the first diffusion barrier layer comprises a semiconductor and a fourth dopant different than the first dopant and the second dopant, wherein the second dopant is boron and the third dopant is carbon.

8. The method of claim 7, further comprising:
   depositing a spacer layer over the first diffusion barrier layer, wherein the sensor semiconductor layer is deposited over the spacer layer.

9. The method of claim 7, further comprising:
   depositing a spacer layer over the backside semiconductor layer, wherein the first diffusion barrier layer is deposited over the spacer layer.

10. The method of claim 7, further comprising:
    depositing a first spacer layer over the backside semiconductor layer, wherein the first diffusion barrier layer is deposited over the first spacer layer; and
    depositing a second spacer layer over the first diffusion barrier layer, wherein the sensor semiconductor layer is deposited over the second spacer layer.

11. The method of claim 7, further comprising:
    depositing a first spacer layer over the first diffusion barrier layer;
    depositing a second diffusion barrier layer over the first spacer layer, the second diffusion barrier layer comprising the fourth dopant,
    depositing a second spacer layer over the second diffusion barrier layer; and depositing a third diffusion barrier layer over the second spacer layer, the third diffusion barrier layer comprising the fourth dopant, wherein the sensor semiconductor layer is deposited over the third diffusion barrier layer.

12. The method of claim 7, wherein the first dopant is boron, and wherein the fourth dopant is oxygen.

13. A method for forming an integrated chip, the method comprising:
- depositing a base semiconductor layer having a first doping type over a semiconductor substrate;
- depositing a backside semiconductor layer having the first doping type over the base semiconductor layer;
- depositing a first diffusion barrier semiconductor layer over the backside semiconductor layer;
- depositing a sensor semiconductor layer having the first doping type over the first diffusion barrier semiconductor layer;
- forming a photodetector region having a second doping type, different than the first doping type, in the sensor semiconductor layer; and
- removing the base semiconductor layer and the semiconductor substrate from along the backside semiconductor layer,
- wherein the sensor semiconductor layer comprises a first dopant, the backside semiconductor layer comprises a second dopant, and the first diffusion barrier semiconductor layer comprises a third dopant different than the first dopant and the second dopant, wherein the sensor semiconductor layer has a first dopant concentration, and wherein the backside semiconductor layer has a second dopant concentration different than the first dopant concentration.

14. The method of claim 13, wherein the second dopant concentration is greater than the first dopant concentration.

15. The method of claim 13, further comprising:
- depositing a spacer semiconductor layer over the first diffusion barrier semiconductor layer; and
- depositing a second diffusion barrier semiconductor layer over the spacer semiconductor layer, wherein the sensor semiconductor layer is deposited over the second diffusion barrier semiconductor layer.

16. The method of claim 15, wherein the first diffusion barrier semiconductor layer has a first thickness, and wherein the second diffusion barrier semiconductor layer has a second thickness different from the first thickness.

17. The method of claim 13, wherein the first dopant and the second dopant comprise boron.

18. The method of claim 17, wherein the third dopant comprises oxygen.

19. The method of claim 13, wherein the backside semiconductor layer further comprises a fourth dopant different than the first dopant, the second dopant, and the third dopant.

20. The method of claim 13, wherein the backside semiconductor layer further comprises a fourth dopant, wherein the second dopant comprises boron, and wherein the third dopant and the fourth dopant comprise carbon.

* * * * *